(12) United States Patent
Kim et al.

(10) Patent No.: US 7,673,220 B2
(45) Date of Patent: Mar. 2, 2010

(54) FLASH MEMORY DEVICE HAVING SINGLE PAGE BUFFER STRUCTURE AND RELATED PROGRAMMING METHOD

(75) Inventors: Moo-Sung Kim, Yongin-si (KR); Seung-Jae Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1039 days.

(21) Appl. No.: 11/363,030

(22) Filed: Feb. 28, 2006

(65) Prior Publication Data
US 2007/0028155 A1 Feb. 1, 2007

(30) Foreign Application Priority Data
Jul. 4, 2005 (KR) ............... 10-2005-0059777

(51) Int. Cl.
*G11C 29/00* (2006.01)

(52) U.S. Cl. ............... 714/773; 714/721; 714/724; 714/745; 365/185.12; 365/185.21

(58) Field of Classification Search ............... 714/721, 714/724, 745, 763, 773; 365/185.12, 185.21
See application file for complete search history.

(56) References Cited

U.S. PATENT DOCUMENTS

| 5,966,326 | A | 10/1999 | Park et al. |
| 6,965,923 | B2 * | 11/2005 | Norman et al. ............... 709/214 |
| 2002/0126531 | A1 | 9/2002 | Hosono et al. |
| 2003/0043628 | A1 | 3/2003 | Lee |
| 2006/0015687 | A1 | 1/2006 | Kim et al. |
| 2006/0215453 | A1 | 9/2006 | Seong |
| 2007/0195635 | A1 * | 8/2007 | Chen et al. ............... 365/230.08 |
| 2008/0112221 | A1 | 5/2008 | Park et al. |

FOREIGN PATENT DOCUMENTS

| JP | 10-106279 | 4/1998 |
| JP | 10-125083 | 5/1998 |
| JP | 2001-325796 | 11/2001 |
| KR | 1998-0021156 | 6/1998 |
| KR | 1998-0025698 | 7/1998 |
| KR | 10-2001-0100809 | 11/2001 |

* cited by examiner

*Primary Examiner*—Guy J Lamarre
(74) *Attorney, Agent, or Firm*—Volentine & Whitt, PLLC

(57) ABSTRACT

A flash memory device is disclosed that comprises memory cells, a sense node connected to a selected bit line, a sense circuit configured to selectively provide a first voltage to a common node in accordance with a voltage level of the sense node, a first register connected to the sense node and the common node and configured to store data in accordance with a voltage level of the common node, a second register configured to store data in accordance with the voltage level of the sense node, a switch configured to provide a second voltage to the second register, and a discharge circuit configured to selectively discharge the sense node in accordance with the data stored in the second register.

16 Claims, 18 Drawing Sheets

FLASH MEMORY DEVICE HAVING SINGLE PAGE BUFFER STRUCTURE AND RELATED PROGRAMMING METHOD

BACKGROUND

1. Field of the Invention

The present invention is related to a semiconductor memory device. In particular, the present invention is related to a non-volatile semiconductor memory device capable of storing multi-bit data.

This application claims priority to Korean Patent Application No. 2005-59777, filed on Jul. 4, 2005, the subject matter of which is hereby incorporated by reference in its entirety.

2. Description of the Related Art

Semiconductor memory devices are vital components in the design of digital logic systems such as computers, and substantially enable microprocessor-based applications ranging from satellites to consumer electronics. Therefore, advances in the fabrication of semiconductor memory devices, including process enhancements and technological developments achieved through scaling for higher integration density and faster operational speeds, help establish performance standards for other digital logic families. A semiconductor memory device may be a volatile random access memory (RAMs) device or a non-volatile memory device. In RAM, logic information is stored either by setting up the logic state of a bi-stable flip-flop, as in a static random access memory (SRAM), or through charging a capacitor, as in a dynamic random access memory (DRAM). In both SRAMs and DRAMs, the stored data may be read from memory as long as power is supplied to the device, but the stored data is lost when power is not supplied. Hence, SRAMs and DRAMs are called volatile semiconductor memory devices.

Non-volatile semiconductor devices, such as MROMs, PROMs, EPROMs, and EEPROMs, are capable of storing data even when power is not supplied to the device. Depending upon the fabrication technology used, a non-volatile semiconductor device may or may not be reprogrammable (i.e., data storage in the device may be changeable or permanent). Non-volatile semiconductor devices are used for program and microcode storage in a wide variety of applications, such as those common to the computer, avionics, telecommunications, and consumer electronics industries.

A combination of volatile and non-volatile memory storage is available in single chip devices, such as non-volatile SRAM (nvRAM). Such devices are used in systems that require fast, programmable non-volatile memory. In addition, dozens of special memory architectures containing additional logic circuitry adapted to optimize memory device performance for application-specific tasks have been created.

As compared with other types of memory devices, it is relatively difficult to write data to, or erase data from non-volatile semiconductor devices, such as the MROM, PROM, and EPROM. On the other hand, EEPROM devices may be electrically erased or written. As a result, the use of EEPROM devices has been expanded and to auxiliary memories or system programming devices requiring continuous update. In particular, a flash EEPROM (hereinafter referred to as "a flash memory device") has a higher degree of integration than a conventional EEPROM device, so it is preferable to use a flash memory device in a large auxiliary memory as opposed to a conventional EEPROM device. Also, a NAND-type flash memory device (i.e., a flash memory device comprising NAND-type flash memory) has a higher degree of integration than a well-known, NOR-type flash memory device (i.e., a flash memory device comprising NOR-type flash memory).

A NAND-type flash memory device comprises a memory cell array in which digital information is stored, and the memory cell array comprises a plurality of cell strings (called NAND strings). The flash memory device also comprises a page buffer circuit that stores data in the memory cell array and reads data from the memory cell array. As is well known in the art, memory cells of a NAND-type flash memory device are erased and programmed using Flowler-Nordheim tunneling current. Erase and program methods for NAND-type flash memory devices are disclosed, for example, in U.S. Pat. Nos. 5,473,563 and 5,696,717, the subject matter of which is hereby incorporated by reference in its entirety.

FIG. 1 is a block diagram showing a conventional flash memory device. As illustrated in FIG. 1, a flash memory device 10 comprises a memory cell array 12, a row decoder circuit 14, and a page buffer circuit 16. Memory cell array 12 comprises memory cells arranged along rows (i.e., along word lines) and along columns (i.e., along columns that correspond to bit lines). The memory cells are configured in a NAND string structure. The word lines (i.e., the rows) of memory cell array 12 are driven by row decoder circuit 14, and the bit lines (i.e., the columns) are driven by page buffer circuit 16. Each memory cell stores 1-bit data or multi-bit data (e.g., 2-bit data). A page buffer circuit configured to store 2-bit data in each memory cell must be designed differently from a page buffer circuit configured to store 1-bit data in each memory cell. As is well known in the art, 1-bit data is stored in a memory cell by a page buffer circuit comprising one latch, while 2-bit data is stored in a memory cell by a page buffer circuit comprising two latches.

Exemplary page buffer circuits that store 2-bit data in memory cells are disclosed, for example, in U.S. Pat. Nos. 5,768,188; 5,862,974; 5,966,326; and, 5,982,663, the subject matter of which is hereby incorporated by reference in its entirety.

In each of the references mentioned above, the disclosed page buffer circuit comprises two latches and requires sense circuits to transfer data stored in memory cells to respective latches during a read operation. Since sense paths to the respective latches differ, a mismatch between sense margins may arise. In particular, in a flash memory device that stores multi-bit data, read errors are caused by the mismatch of sense margins.

With continuing demand for a higher integration density, flash memory devices are increasingly required to perform various operations, such as cache program, page copy-back, etc. In the cache program operation, while data is programmed during the current program interval, data to be programmed during the next program interval is loaded into a page buffer circuit. In the page copy-back operation, data is moved from one page to another through a page buffer circuit. Like a multi-bit flash memory device, a page buffer circuit requires two latches to perform these operations.

Exemplary page buffer circuits adapted to perform the above-mentioned operations are disclosed, for example, U.S. Pat. Nos. 6,717,857 and 6,671,204, the subject matter of which is hereby incorporated by reference in its entirety.

Unfortunately, a conventional page buffer circuit capable of performing the page copy-back and/or cache program operations has a different structure than a conventional page buffer circuit capable of performing multi-bit programming. Thus, separate page buffer circuits must be provided to perform all of these disparate operations. Unfortunately, the provision of multiple page buffer circuits having different structures drives the cost of memory devices higher.

SUMMARY OF THE INVENTION

Embodiments of the invention provide a flash memory device capable of performing multi-bit program and read operations, single bit program and read operations, a cache program operation, and/or a page copy-back operation using a single page buffer structure.

In one embodiment, the invention provides a flash memory device comprising a plurality of memory cells arranged along a plurality of bit lines and a plurality of word lines, a sense node connected to a selected bit line, and a sense circuit configured to selectively provide a first voltage to a common node in accordance with a voltage level of the sense node. The flash memory device further comprises a first register connected to the sense node and the common node and configured to store data in accordance with a voltage level of the common node, a second register configured to store data in accordance with the voltage level of the sense node, a switch configured to provide a second voltage to the second register, and a discharge circuit configured to selectively discharge the sense node in accordance with the data stored in the second register.

In another embodiment, the invention provides a flash memory device comprising an array of memory cells arranged along a plurality of word lines and a plurality of bit lines, a bit line select and bias block configured to select a group of bit lines comprising at least one of the plurality of bit lines, and a page buffer block comprising a plurality of page buffers, each page buffer corresponding to at least one of the plurality of bit lines. Each of the page buffers comprises a sense node connected to a corresponding bit line through the bit line select and bias block, and a sense circuit configured to selectively provide a first voltage to a common node in accordance with a voltage level of the sense node. Each of the page buffers further comprises a first register connected to the sense node and the common node and configured to store data in accordance with a voltage level of the common node, a second register configured to store data in accordance with the voltage level of the sense node, a switch configured to provide a second voltage to the second register, and a discharge circuit configured to selectively discharge the sense node in accordance with the data stored in the second register.

In yet another embodiment, the invention provides a multi-bit programming method for a flash memory device comprising a first register, a second register, and a plurality of memory cells arranged along a plurality of bit lines and a plurality of word lines. The method comprises performing an initial read operation during an initial read interval, performing a first program operation, performing a first verify read operation during a first verify read interval, wherein the first verify read operation comprises selectively discharging a sense node, and performing a second verify read operation during a second verify read interval.

DESCRIPTION OF THE DRAWINGS

Exemplary embodiments of the invention will be described hereinafter with reference to the accompanying drawings, in which like reference symbols indicate like or similar components. In the drawings.

DESCRIPTION OF THE EXEMPLARY EMBODIMENTS

This application is related to commonly-assigned, co-pending applications and, the subject matter of which is hereby incorporated by reference in its entirety.

Figure 1:
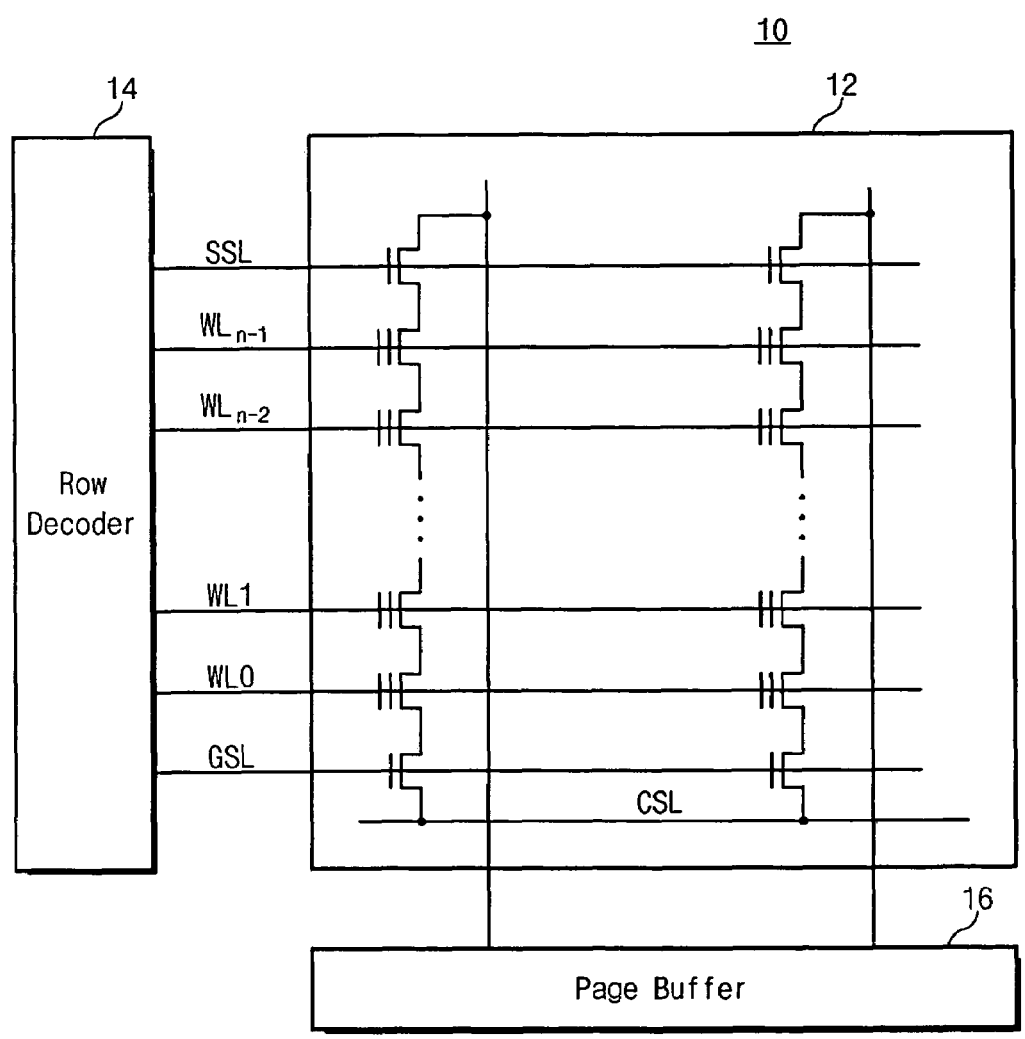
FIG. 1 is a block diagram showing a conventional flash memory device.
Figure 2:
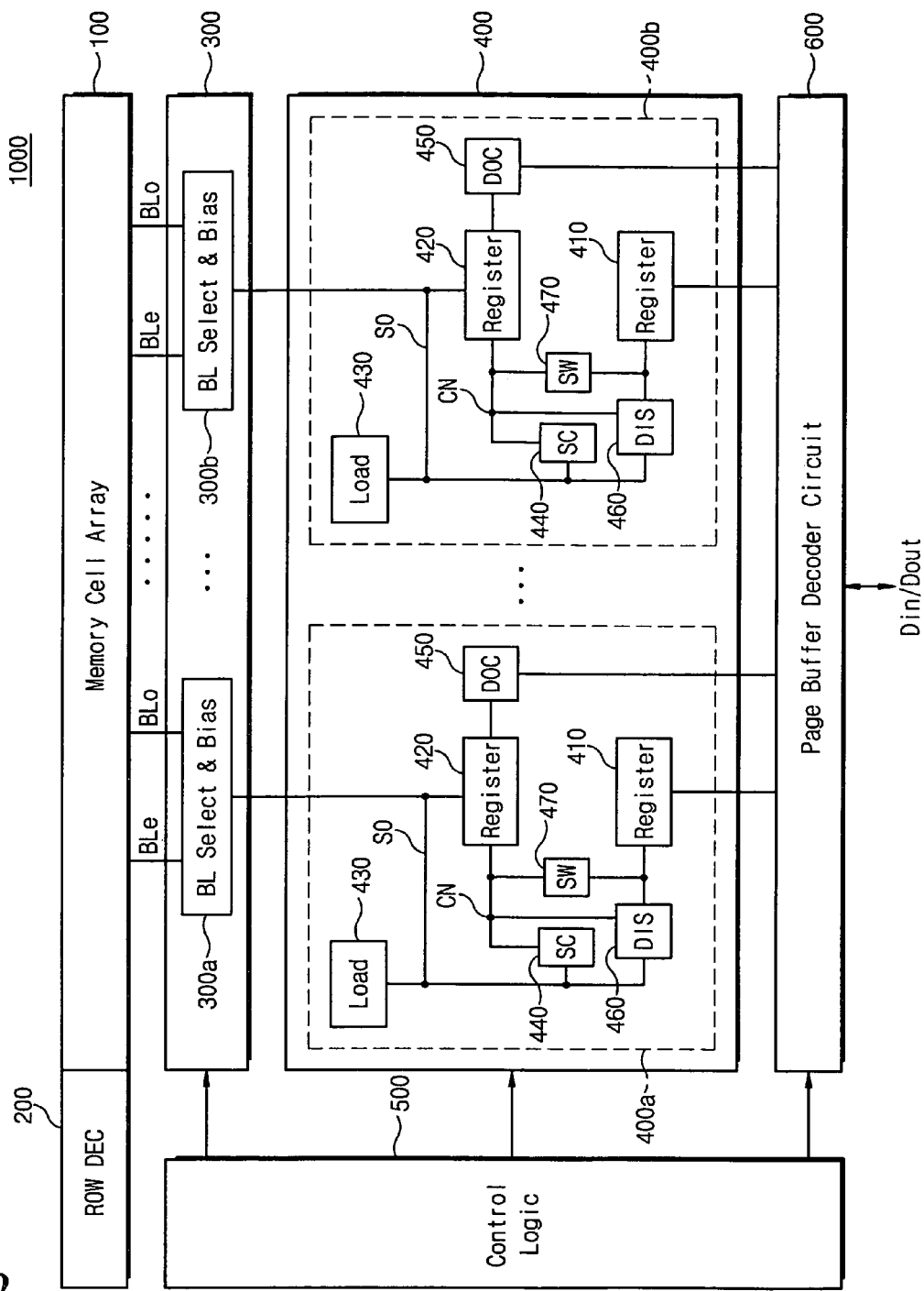
FIG. 2 is a block diagram of a flash memory device in accordance with the present invention.

FIG. 2 is a block diagram of a flash memory device in accordance with one embodiment of the invention. Referring to FIG. 2, a flash memory device 1000 comprises a memory cell array 100 adapted to store data. Memory cell array 100 comprises a plurality of memory cells arranged in rows and columns (i.e., arranged along a plurality of word lines and a plurality of bit lines). Each of the memory cells stores 1-bit data or multi-bit data (e.g., 2-bit data). A row decoder circuit 200 is adapted to select a row of memory cell array 100, drive the selected row with a first word line voltage, and drive each of the unselected rows with a second word line voltage. For example, during a first program operation, row decoder circuit 200 drives a selected row with a program voltage and unselected rows with a pass voltage, respectively. Also, for example, during a read operation, row decoder circuit 200 drives a selected row with a read voltage and unselected rows with a pass voltage, respectively. Examples of read operations are verify read operations of multi-bit and single bit operating modes, normal read operations, and the like.

Flash memory device 1000 further comprises; a bit line select and bias block 300, a page buffer block 400, a control logic block 500, and a page buffer decoder circuit 600.

Control logic block 500 controls bit line select and bias block 300. Bit line select and bias block 300 and is adapted to select a group of bit lines from among the plurality of bit lines of memory cell array 100. For example, during program and read operations, bit line select and bias block 300 is adapted to select either odd-numbered bit lines BLo or even-numbered bit lines BLe from among the plurality of bit lines. Thus, each row comprises two pages. Bit line select and bias block 300 comprises a plurality of bit line select and bias circuits 300a through 300b, each of which corresponds to two bit lines. Also, the bit lines of a given select and bias circuit (e.g., 300a) correspond to different pages, respectively, within a given row (i.e., word line). During a given operation, each of the bit line select and bias circuits 300a through 300b performs the operation on one of bit lines BLe or BLo. As described above, one row comprises two pages, but it will be clear to one skilled in the art that one row may comprise one page or more than two pages. Various conventionally understood bit line select and bias block 300 circuits may be incorporated into the working example. (See, for example, U.S. Pat. Nos. 6,717,857 and 6,671,204). Therefore, a detailed description of this block will not be given herein.

Page buffer block 400 operates as a sense amplifier or a write driver in accordance with the operating mode of flash memory device 1000. For example, during a program operating mode (i.e., during a first program operation), page buffer block 400 stores data input through page buffer decoder circuit 600 and drives bit lines selected by bit line select and bias block 300 with a program voltage (e.g., a ground voltage) or a program-inhibition voltage (e.g., a power supply voltage) in accordance with the data stored in page buffer block 400. During a read operating mode (i.e., during a read operation), page buffer block 400 senses data from a selected memory cell through a selected bit line (i.e., a bit line that corresponds to a selected memory cell). The sensed data is output to a data line bus (i.e., to a component outside of flash memory device 1000). Control logic block 500 controls page buffer block 400. Page buffer block 400 comprises a plurality of page buffers 400a through 400b, each of which corresponds to a respective bit line select and bias circuit of bit line select and bias circuits 300a through 300b. Since page buffers 400a through 400b are each configured in the same way, the constituent elements of each of page buffers 400a through 400b will be described in more detail below in relation to only one exemplary page buffer (e.g., 400a).

Page buffer 400a comprises two registers 410 and 420, a load circuit 430, a sense circuit 440 (also indicated as SC in FIG. 2), a data output circuit 450 (also indicated as DOC in FIG. 2), a discharge circuit 460 (also indicated as DIS in FIG. 2), and a switch 470 (also indicated as SW in FIG. 2). Each of registers 410 and 420 is called a sense and latch circuit.

Alternatively, register 410 is referred to as a cache register and register 420 is referred to as a main register. A sense node S0 is electrically connected to a bit line that is selected by a corresponding bit line select and bias circuit (i.e., bit line select and bias circuit 300a). Registers 410 and 420 are each configured to latch data, as will be described in more detail below. Load circuit 430 is connected to sense node S0 and supplies a voltage to sense node S0. Data output circuit 450 is configured to output data that is stored in main register 420 to page buffer decoder circuit 600.

Sense circuit 440 is configured to selectively provide a voltage to a common node CN in accordance with the voltage level of sense node S0. Discharge circuit 460 is connected to sense node S0, common node CN, and cache register 410; and is configured to discharge sense node S0 or common node CN in accordance with the data value stored in cache register 410. For example, when data stored in cache register 410 is transferred to main register 420, discharge circuit 460 selectively discharges common node CN in accordance with the data value stored in cache register 410. During a "00" verify read interval of an MSB program operation, which will be described later, discharge circuit 460 selectively discharges sense node S0 in accordance with the data value stored in cache register 410. Switch 470 is used to provide a voltage from common node CN to cache register 410 during an initial read interval of the MSB program operation, which will be described later.

Flash memory device 1000 can perform multi-bit program, cache program, and page copy-back functions using the page buffer structure described above. That is, a multi-bit program operation, a cache program operation, and a page copy-back operation may each be performed using a single page buffer structure. Thus, the management of separate memory devices to support those functions is not necessary when the page buffer described above is used in a flash memory device.

Figure 3:
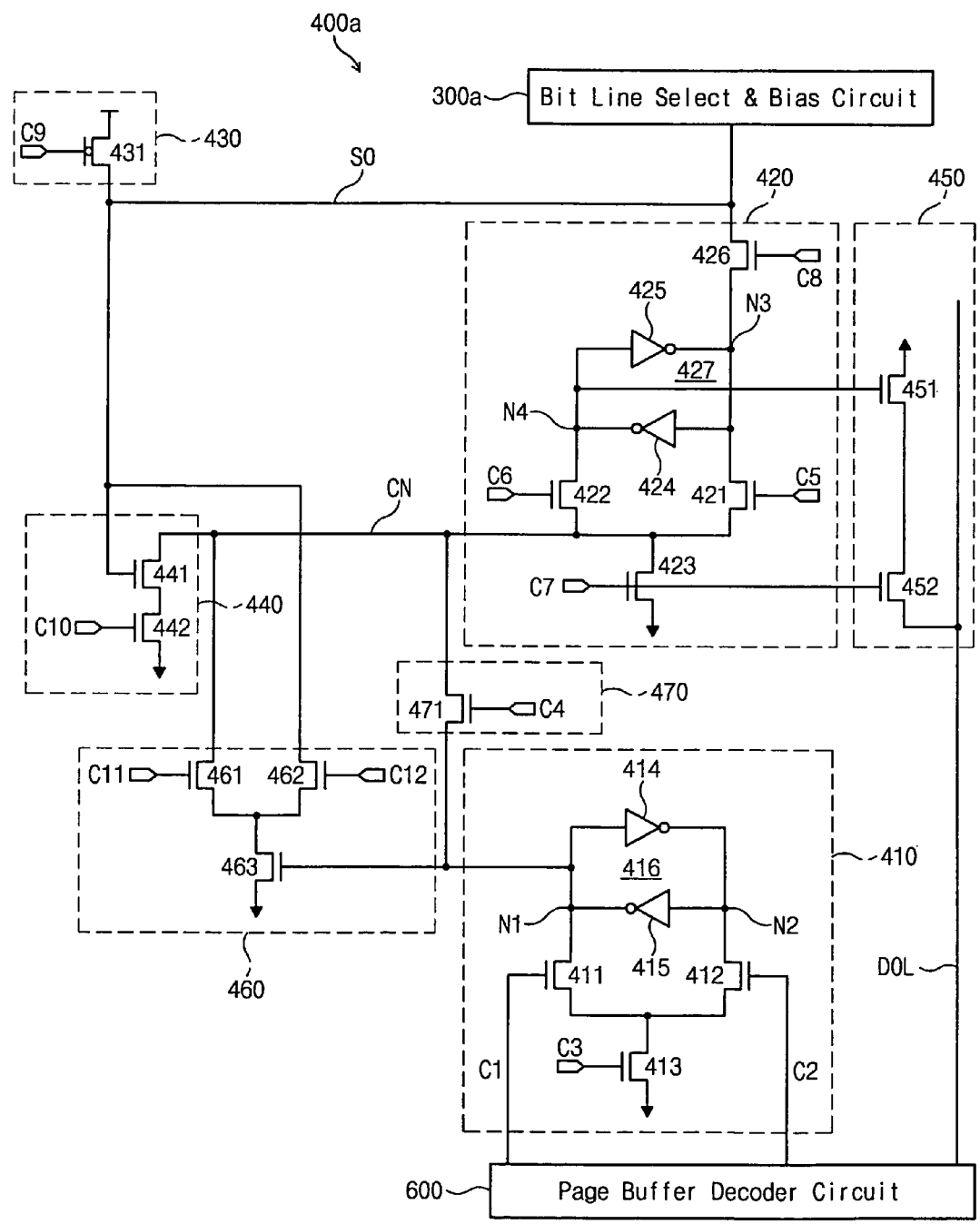
FIG. 3 is a circuit diagram of one of the page buffers illustrated in FIG. 2.

FIG. 3 is a circuit diagram of page buffer 400a of FIG. 2. As illustrated in FIG. 3, page buffer 400a comprises two registers 410 and 420, a load circuit 430, a sense circuit 440, a data output circuit 450, a discharge circuit 460, and a switch 470.

Register 410 has three NMOS transistors 411, 412, and 413; and two inverters 414, and 415. Inverters 414 and 415 are connected to form a latch 416. NMOS transistor 411 has a source, a drain connected to a first latch node N1, and a gate connected to a control signal C1. NMOS transistor 413 has a gate that is connected to a control signal C3 and is connected between the source of transistor 411 and a ground voltage. NMOS transistor 412 has a gate connected to a control signal C2, a drain connected to a second latch node N2, and a source connected to the drain of NMOS transistor 413.

In this exemplary embodiment, control signals C1 and C2 have complementary logic levels during the data load interval, which is when latch 416 receives program data. For example, when the data value "1" is loaded into latch 416, control signal C1 has a logic high level and control signal C2 has a logic low level. When the data value "0" is loaded into latch 416, control signal C1 has a logic low level and control signal C2 has a logic high level. In order to reset latch 416 such that first latch node N1 has a logic low level and second latch node N2 has a logic high level (i.e., to perform a first reset operation), control signals C1 and C2 are set to a logic high level and a logic low level, respectively, and control signal C3 is set to a logic high level. Control logic block 500 (of FIG. 2) provides control signal C3 to NMOS transistor 413, which is activated (i.e., set to a logic high level) during the data load interval. NMOS transistors 411, 412, and 413 constitute a register switch circuit that selectively connects one of first and second latch nodes N1 and N2 to a ground voltage in response to control signals C1, C2, and C3. As used herein, "program data" is a representative data value that corresponds to an actual data value that will be programmed into a selected memory cell. In one embodiment, program data may be LSB program data (i.e., program data that represents an actual data value to be programmed into a selected memory cell during an LSB program operation), or MSB program data (i.e., program data that represents an actual data value to be programmed into a selected memory cell during an MSB program operation). Also, as used herein, when a data value is said to be "loaded into," "loaded in," "stored in," etc., a latch (e.g., latch 416), it means that logic levels are stored in the latch nodes of the latch (e.g., first and second latch nodes N1 and N2) in a way that represents the data value to be stored (or loaded, etc.) in the latch. Also, as used herein, the term "activate" as used in reference to a signal means to set the signal to a logically high level. Similarly, the term "deactivate" means setting a signal to a logically low level. (In this regard, however, low and high are merely selected logic examples and could be easily reversed in their nature).

Main register 420 has four NMOS transistors 421, 422, 423, and 426; and two inverters 424, and 425. Inverters 424 and 425 are connected to form a latch 427. NMOS transistor 421 has a gate that is connected to a control signal C5, a drain that is connected to a third latch node N3, and a source that is connected to common node CN. NMOS transistor 422 has a gate that is connected to a control signal C6, a drain that is connected to a fourth latch node N4, and a source that is connected to common node CN. NMOS transistor 423 has a gate that is connected to a control signal C7, a drain that is connected to common node CN, and a source that is connected to a ground voltage. NMOS transistor 426 has a gate that is connected to a control signal C8, and is connected between sense node S0 and third latch node N3.

In this exemplary embodiment, control logic block 500 of FIG. 2 provides control signals C5, C6, C7, and C8 to main register 420. Control signal C5 is activated when the data value stored in cache register 410 is transferred through discharge circuit 460 to main register 420. Control signal C6 is activated when latch 427 is reset, and during the sense interval of each read operation. A sense interval is an interval during which the voltage apparent on the selected bit line is provided to sense node S0. Control signal C7 is activated when latch 427 is reset, and during each data output interval. Control signal C8 is activated when data stored in latch 427 is transferred to the selected bit line during a program interval.

Load circuit 430 comprises a PMOS transistor 431 that is connected between a power supply voltage and sense node S0, and that is controlled by control signal C9. Sense circuit 440 comprises two NMOS transistors 441 and 442. NMOS transistor 441 has a drain that is connected to common node CN, a source that is grounded via NMOS transistor 442, and a gate that is connected to sense node S0. NMOS transistor 442 is controlled by a control signal C10, which functions as a latch signal. Data output circuit 450 comprises two NMOS transistors 451 and 452 that are connected in series between a signal line DOL and a ground voltage. NMOS transistor 451 is controlled in accordance with the data value of fourth latch node N4 of main register 420, and NMOS transistor 452 is controlled by control signal C7.

Discharge circuit 460 comprises three NMOS transistors 461, 462, and 463. NMOS transistor 461 has a source, a drain that is connected to common node CN, a gate that is connected to a control signal C11 (i.e., a second discharge control signal). NMOS transistor 463 has a gate that is connected to first latch node N1 and is connected between the source of NMOS transistor 461 and a ground voltage. NMOS transistor 462 is controlled by control signal C12 (i.e., a first discharge control signal) and is connected between sense node S0 and the drain of transistor 463. Switch 470 comprises an NMOS transistor 471 that is controlled by control signal C4 (i.e., a switch control signal) and is connected between common node CN and first latch node N1.

In this exemplary embodiment, control signal C10 is activated during the "01" verify and initial read intervals of each MSB program operation and the sense interval of each normal read operation. Control signal C11 is activated when data stored in cache register 410 is transferred to main register 420. Control signal C12 is activated during a "00" verify interval of the MSB program operation, and control signal C4 is activated during initial read interval of MSB program operation.

A multi-bit program operation for the flash memory device of the present invention will now be described generally.

Figure 4A:
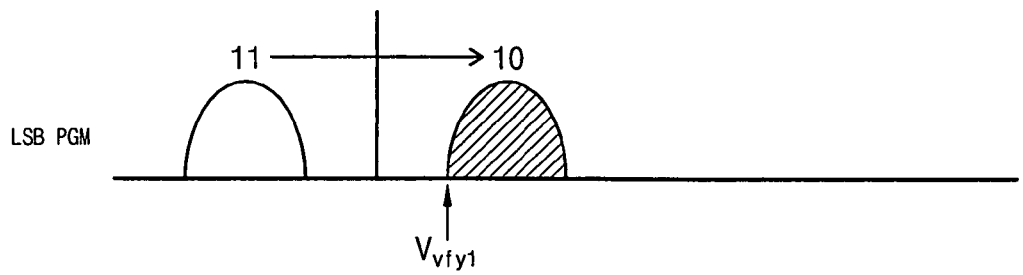
FIGS. 4A and 4B are diagrams for describing a multi-bit program operation in accordance with the present invention.
Figure 4B:
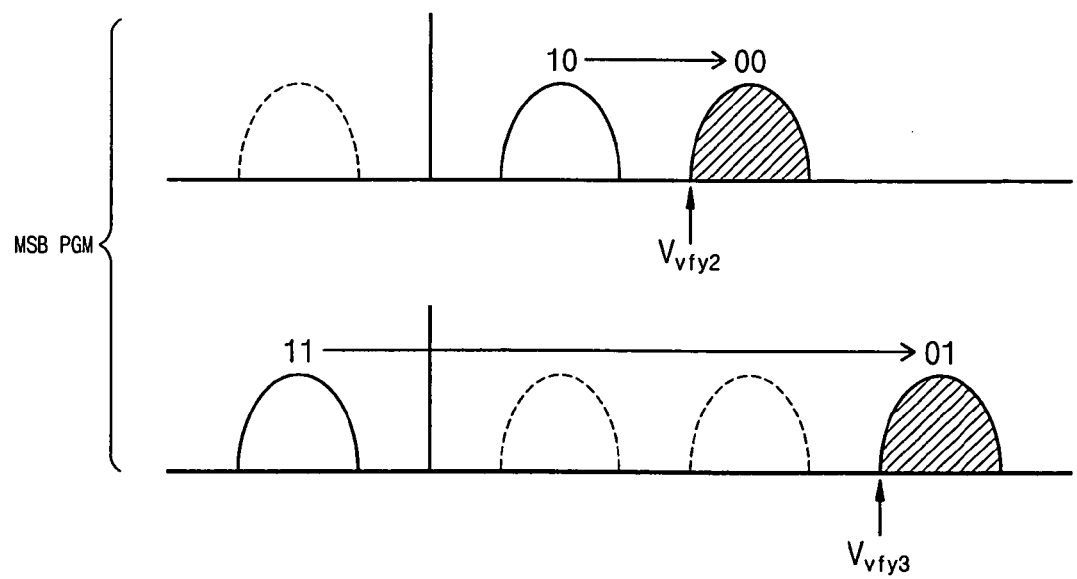
Figure 4B:
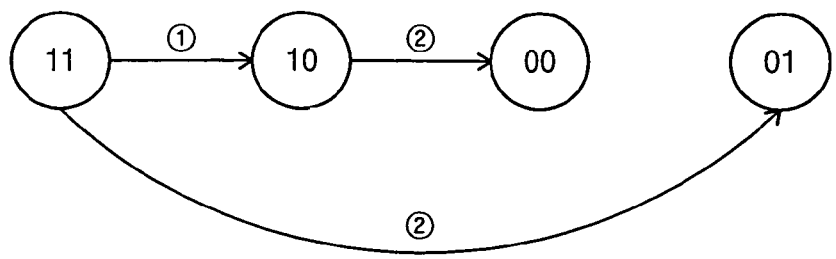

To store 2-bit data in a selected memory cell, a flash memory device in accordance with the present invention performs both an LSB program operation and an MSB program operation. Through the LSB and MSB program operations, a selected memory cell is programmed to store one of the following data values: "11," "10," "00," or "01." A memory cell storing a data value of "11" is an erased memory cell, and a memory cell storing a data value of "10" has a threshold voltage higher than that of a memory cell storing a data value of "11." In addition, a memory cell storing a data value of "00" has a threshold voltage higher than that of a memory cell storing a data value of "10." Finally, a memory cell storing a data value of "01" has a threshold voltage higher than that of a memory cell storing a data value of "00." Under the conditions set forth above, after an LSB program operation has been performed on a selected memory cell, the selected memory cell stores a data value of either "11" (i.e., the selected memory cell is an erased memory cell), or "10," as illustrated in FIG. 4A. After performing the MSB program operation, which is performed after the LSB program operation, a selected memory cell that stored a data value of "11" after the LSB program operation will store a data value of either "11" or "01," while a selected memory cell that stored a data value of "10" after the LSB program operation will store a data value of "10" or "00," as illustrated in FIG. 4B.

Figure 5:
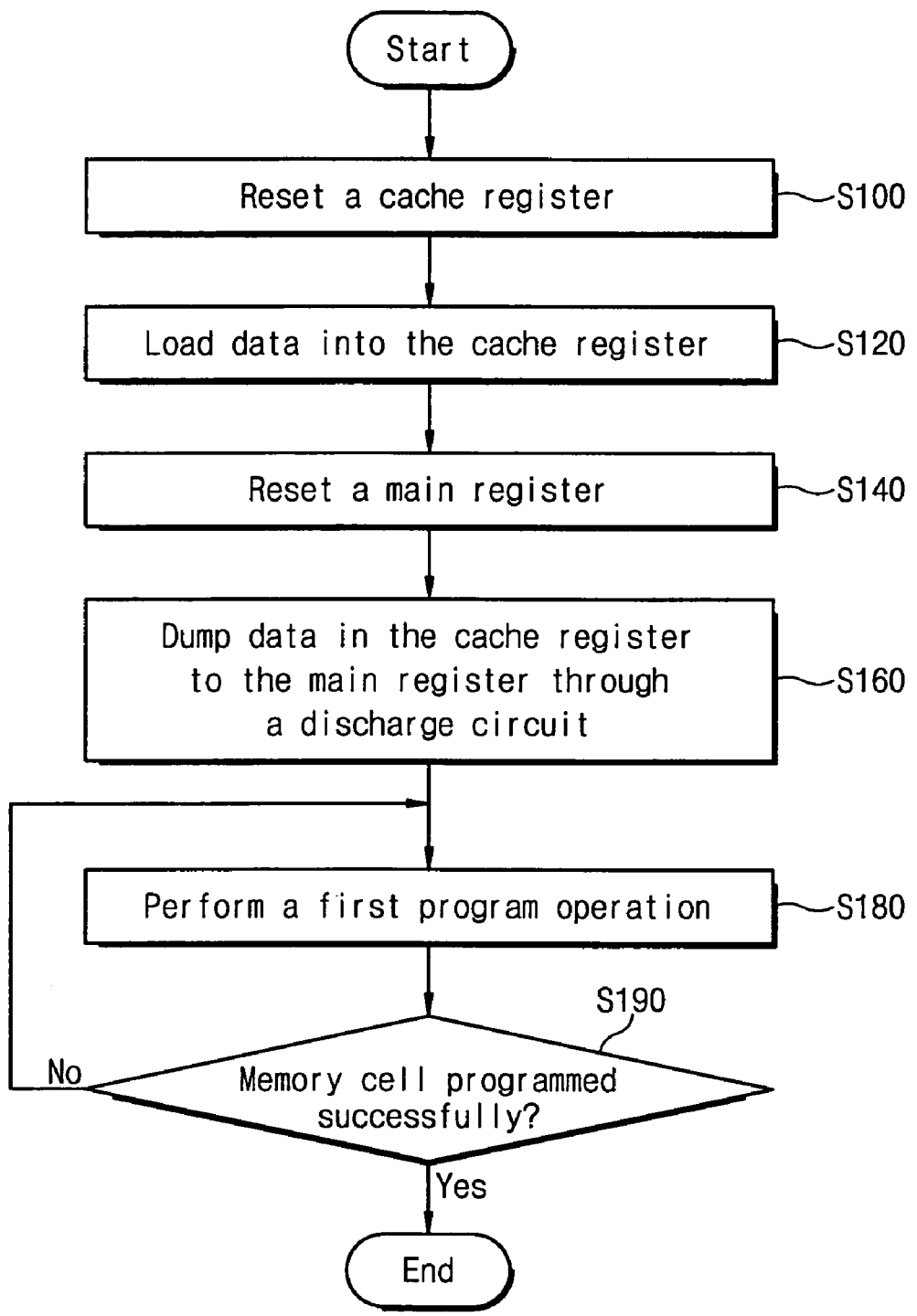
FIG. 5 is a flowchart describing an LSB program operation of a flash memory device in accordance with the present invention.
Figure 6:
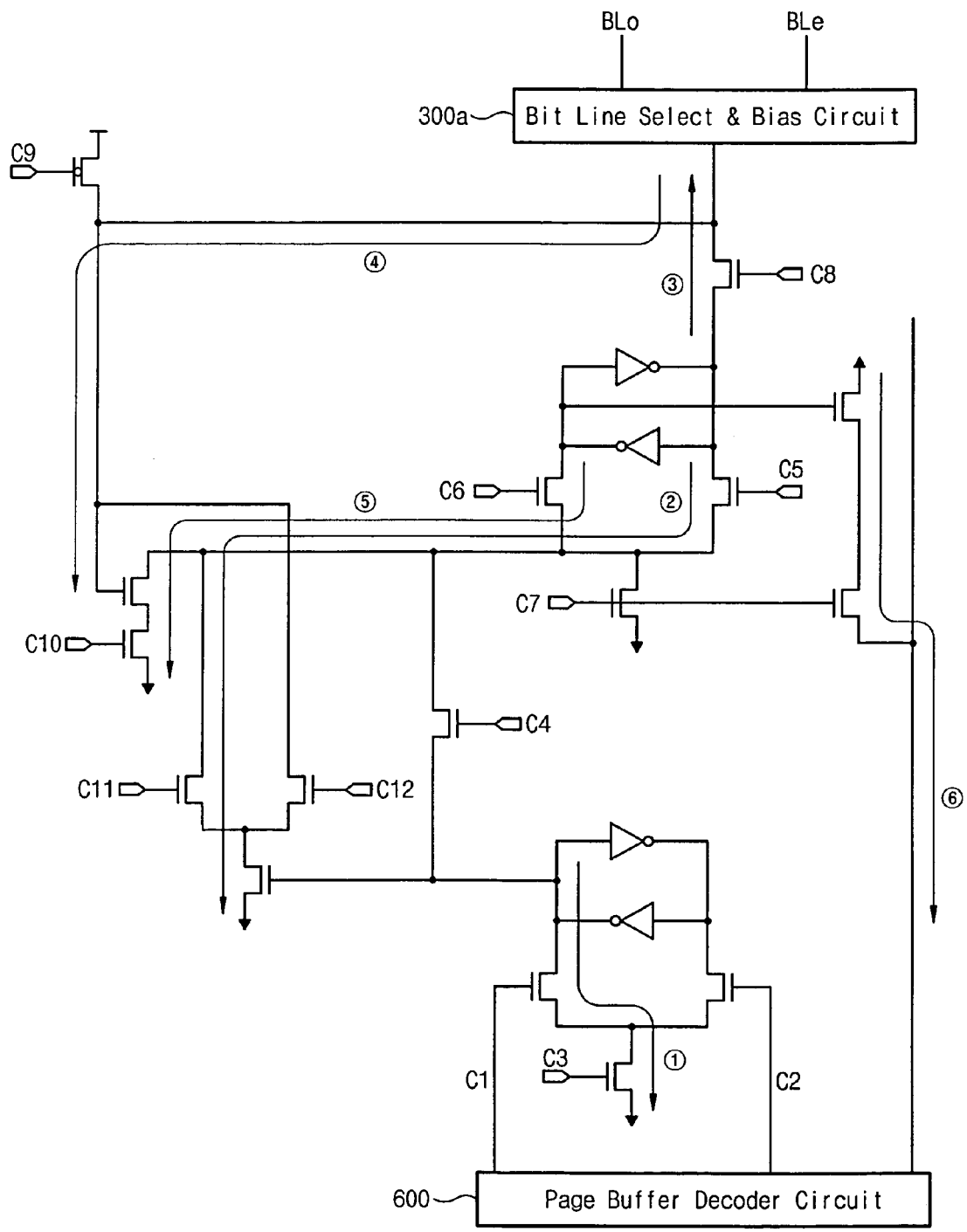
FIG. 6 is a circuit diagram illustrating the flow of data through portions of a flash memory device in accordance with the present invention during the LSB program operation.

FIG. 5 is a flowchart describing an LSB program operation for a flash memory device in accordance with the present invention, and FIG. 6 is a circuit diagram illustrating the flow of data through portions of a flash memory device in accordance with the present invention during the LSB program operation. An LSB program operation will now be described with reference to FIGS. 3, 4A, 5, and 6. An LSB program operation is performed through an iteration of program loops. Each program loop comprises an LSB program interval that comprises a first program operation and an LSB verify interval that comprises an LSB verify read operation. The LSB verify read operation is called a "10" verify read operation.

Once the LSB program operation commences, first and second latch nodes N1 and N2 of cache register 410 are reset to a logic high level and a logic low level, respectively, (i.e., a second reset operation is performed) by activating control signals C2 and C3 (S100). After resetting cache register 410, LSB program data is loaded into cache register 410 through page buffer decoder circuit 600 during a data load interval (S120). During this data load interval, control signal C3 is set to a logic high level, and LSB program data having a data value of either "1" or "0" is loaded into cache register 410. LSB program data having a value of "1" is loaded into cache register 410 by setting control signal C1 to a logic high level and control signal C2 to a logic low level. Thus, first latch node N1 is grounded through NMOS transistors 411 and 413 (i.e., through signal path ① of FIG. 6), which sets the first latch node N1 to a logic low level and set second latch node N2 to a logic high level. On the other hand, LSB program data having a value of "0" is loaded into main register 410 by setting control signal C1 to a logic low level and setting control signal C2 to a logic high level. Thus, second latch node N2 is grounded through NMOS transistors 412 and 413, which sets the first latch node N1 to a logic high level and sets the second latch node N2 to a logic low level.

After program data is loaded into cache register 410, by activating control signals C6 and C7, main register 420 is reset such that third and fourth latch nodes N3 and N4 have a logic high level and a logic low level, respectively (S140) (i.e., a second reset operation is performed). After resetting main register 420, data stored in cache register 410 is transferred to main register 420 through a discharge circuit 460 during a data dump interval by activating control signals C5 and C11 (S160). When control signals C5 and C11 are activated, NMOS transistors 421 and 461 are turned on. When the data value stored in cache register 410 is "1," first latch node N1 has a logic low level, so NMOS transistor 463 is turned (or remains) off; and thus, third latch node N3 of main register 420 retains its reset state. That is, since NMOS transistor 463 is turned off, current path ② of FIG. 6 is not formed between common node CN and a ground voltage. Thus, main register 420 maintains its reset state (i.e., third latch node N3 retains its logic high level and fourth latch node N4 retains its logic low level). On the other hand, when the data value stored in cache register 410 is "0," first latch node N1 has a logic high level, so NMOS transistor 463 is turned on; and thus, third latch node N3 of main register 420 is grounded through NMOS transistors 421, 461, and 463 (i.e., through signal path ② of FIG. 6). Thus, third and fourth latch nodes N3 and N4 of main register 420 are set to a logic low level and a logic high level, respectively. As used herein, storing a data value in a sense and register circuit, memory cell, or any other component of a flash memory device may refer to either changing the data value that is stored in that component or leaving the data value stored in that component unchanged.

Once the LSB program data is transferred from cache register 410 to main register 420 as described above, a first program operation is executed (S180). When the first program operation is executed, the voltage level of the selected bit line is determined through a signal path ③ of FIG. 6 in accordance with the data stored in main register 420. The first program operation is well known in the art, so description thereof is omitted herein. After the first program operation is performed, an operation is performed to determine whether or not the selected memory cell has been programmed successfully (S190). That is, an LSB verify read operation (i.e., a "10" verify read operation) is performed. During the "10" verify read operation, a verify voltage Vvfy1 (refer to FIG. 4A) is applied to the selected word line (i.e., the word line that corresponds to the selected memory cell) and a resulting voltage variation of the selected bit line is reflected on sense node S0 through signal path ④ of FIG. 6. For example, if a memory cell has a threshold voltage that is lower than the verify voltage Vvfy1, the voltage level of sense node S0 (in accordance with the voltage level of the selected bit line) decreases toward a ground voltage. Thus, NMOS transistor 441 of sense circuit 440 is turned (or remains) off. During the "10" verify read operation, although NMOS transistors 422 and 442 are turned on through the activation of control signals C6 and C10, the data value stored in main register 420 does not change. On the other hand, if a memory cell has a threshold voltage that is greater than or equal to the verify voltage Vvfy1, the voltage level of sense node S0 (in accordance with the voltage level of the selected bit line) is increased toward a power supply voltage. Thus, NMOS transistor 441 of sense circuit 440 is turned on. During the "10" verify read operation, since NMOS transistors 422 and 442 are turned on through the activation of control signals C6 and C10, signal path ⑤ of FIG. 6 is formed when NMOS transistor 441 is turned on. Thus, third and fourth latch nodes N3 and N4 are set to a logic high level and a logic low level, respectively. When third latch node N3 is set to a logic high level, the selected memory cell is program inhibited during any subsequently executed program loops.

After the "10" verify read operation is executed, data stored in main register 420 is transferred to page buffer decoder circuit 600 through data output circuit 450 by activating control signal C7. For example, when fourth latch node N4 has a logic low level, NMOS transistor 451 of data output circuit 450 is turned (or remains) off; and thus, signal line DOL maintains its pre-charged level (e.g., a logic high level). On the other hand, when fourth latch node N4 has a logic high level, NMOS transistor 451 is turned on; and thus, signal line DOL is grounded (see signal path ⑥ of FIG. 6). The logic level of signal line DOL is provided to a pass/fail check circuit (not shown) through page buffer decoder circuit 600. The pass/fail check circuit determines, based on the data input to the pass/fail check circuit, whether the selected memory cell has been successfully programmed. In accordance with the judgment result, another LSB program loop is executed or the LSB program operation ends.

Figure 7:
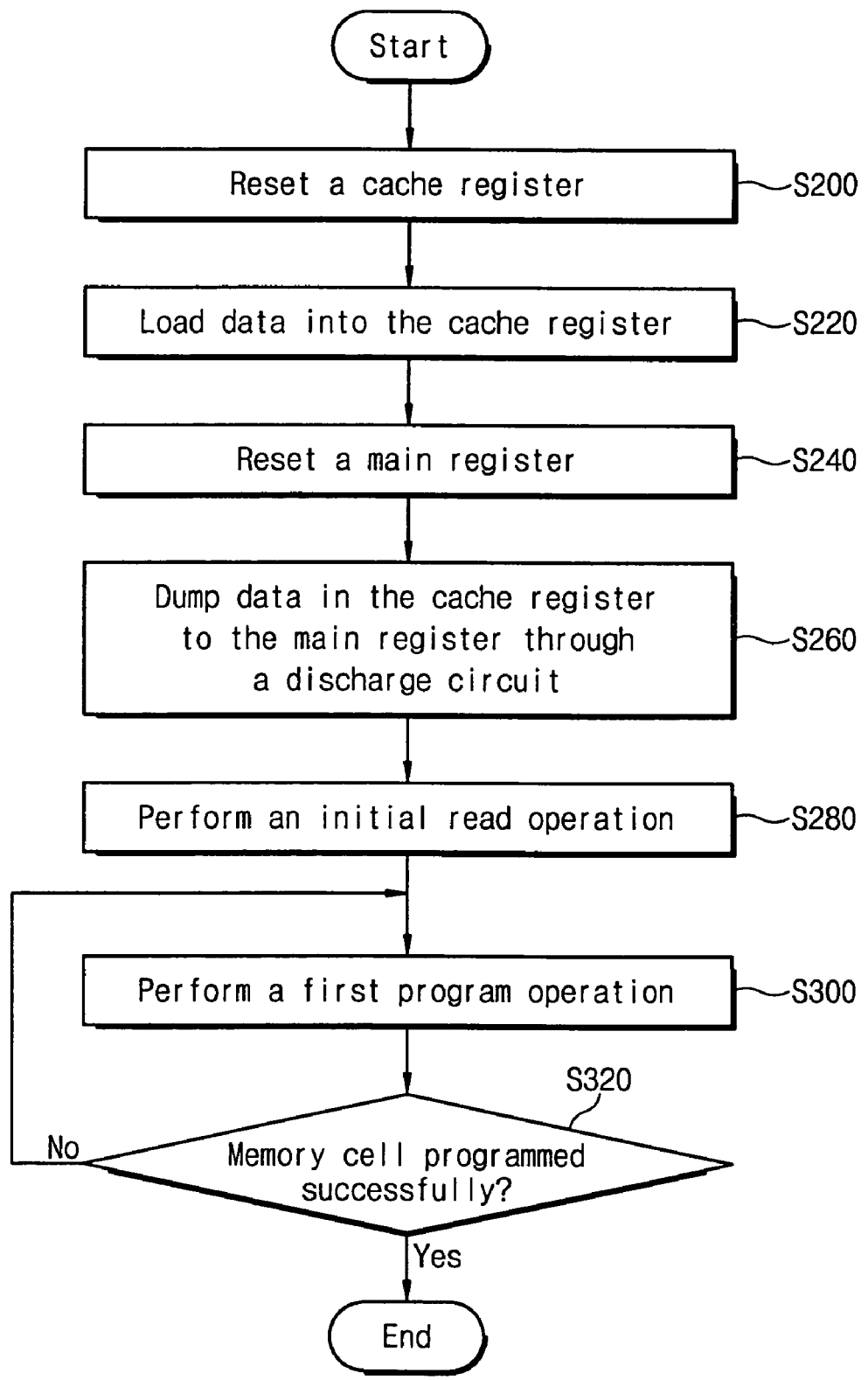
FIG. 7 is a flowchart describing an MSB program operation of a flash memory device in accordance with the present invention.
Figure 8A:
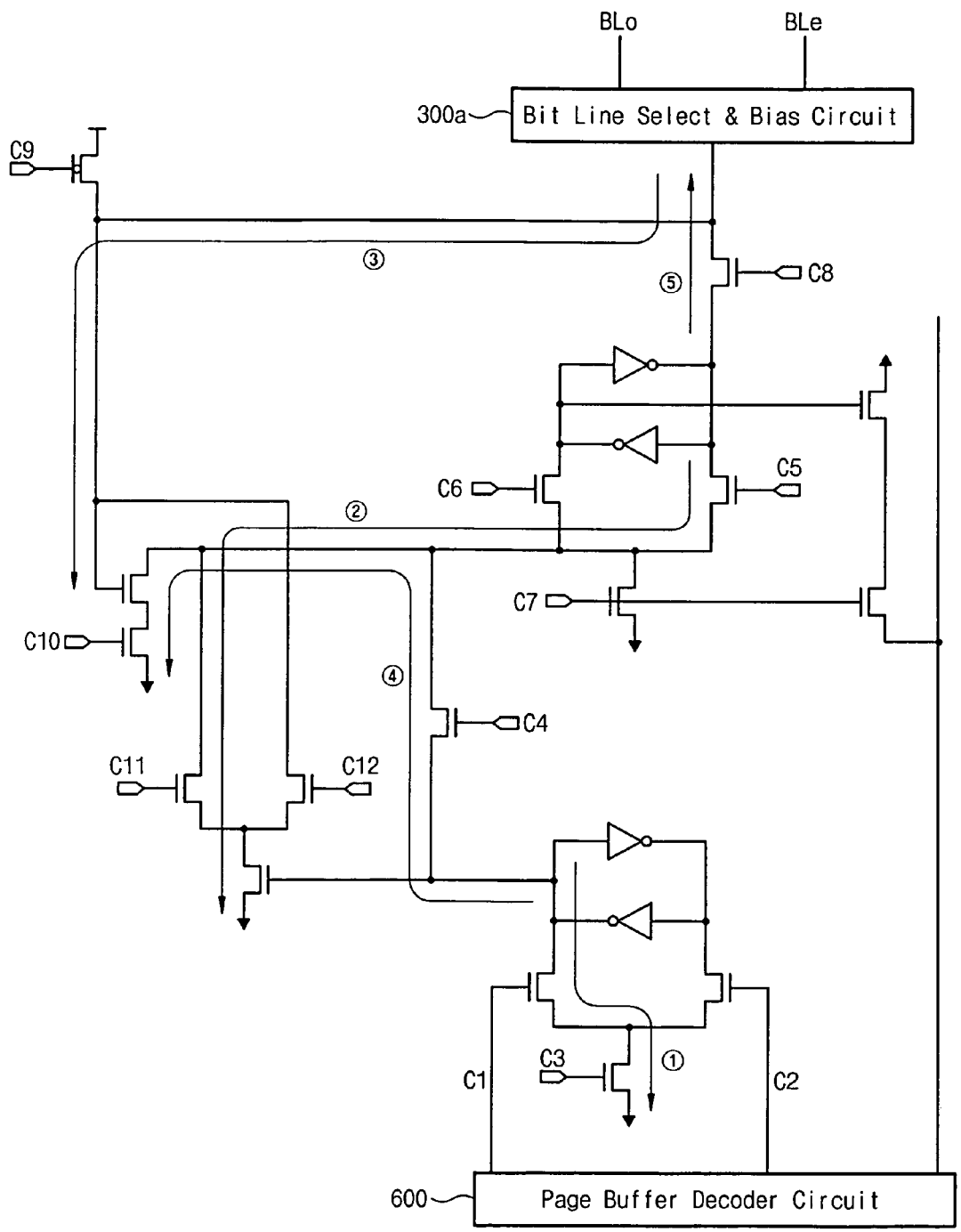
FIGS. 8A and 8B are circuit diagrams illustrating the flow of data through portions of a flash memory device in accordance with the present invention during the MSB program operation.
Figure 8B:
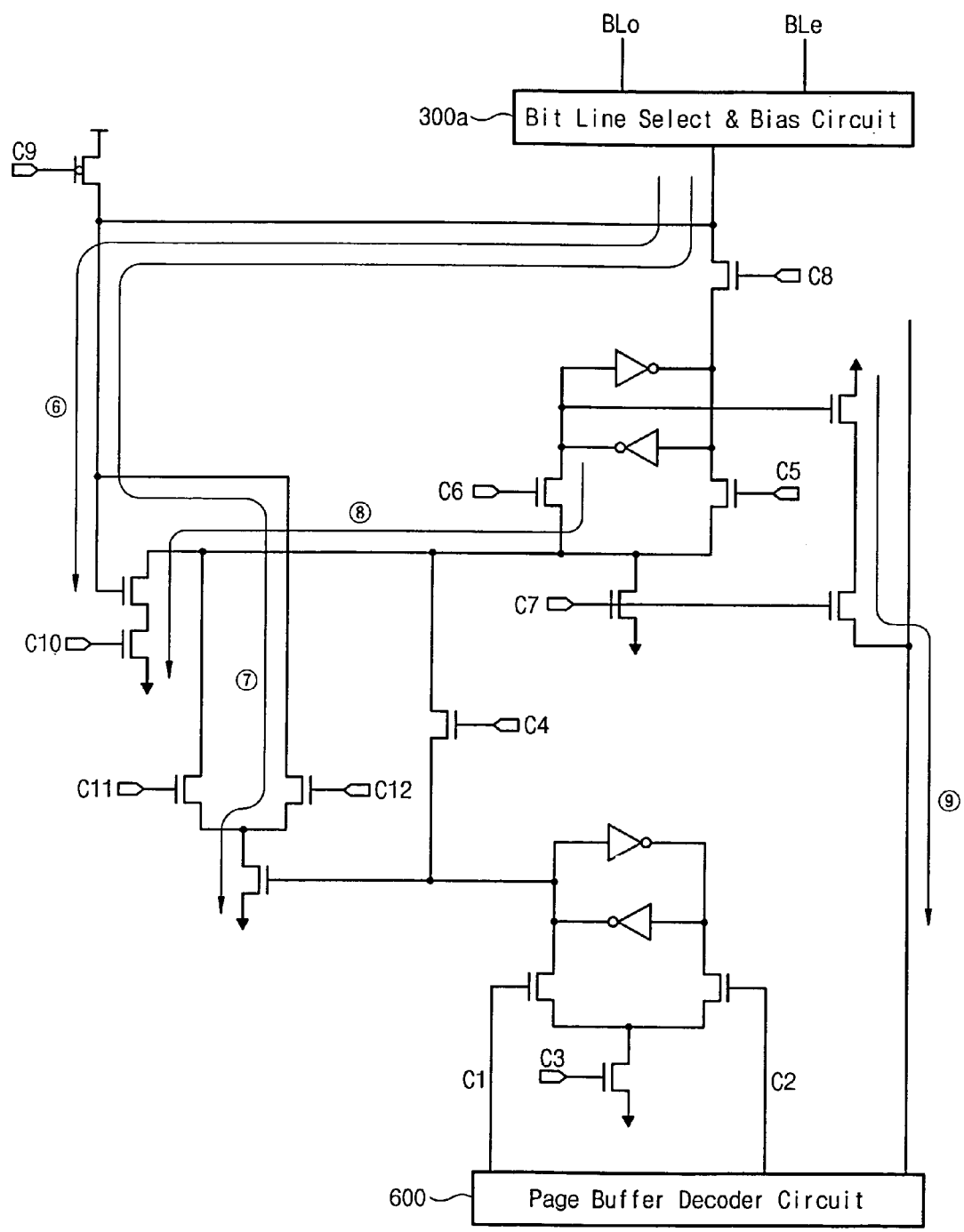

FIG. 7 is a flowchart describing an MSB program operation of a flash memory device in accordance with the present invention, and FIGS. 8A and 8B are circuit diagrams illustrating the flow of data through portions of a flash memory device in accordance with the present invention during the MSB program operation. An MSB program operation will now be described with reference to FIGS. 3, 4B, 7, 8A, and 8B. An MSB program operation is performed through the iteration of MSB program loops. Each MSB program loop comprises an MSB program interval that comprises a first program operation, a first MSB verify read interval (called a "00" verify read interval) that comprises a first MSB verify read operation, and a second MSB verify read interval (called a "01" verify read interval) that comprises a second MSB verify read operation. The first MSB verify read operation is called a "00" verify read operation and the second MSB verify read operation is called a "01" verify read operation. As will be described below, the first and second MSB verify read operations are executed sequentially.

In FIG. 7, steps S200 through S260 of the MSB program operation are the same as steps S100 through S160 of the LSB program operation, respectively, except that in steps S220 and S260, MSB program data is manipulated rather than LSB program data as in steps S120 and S160. Thus, further description of steps S200 through S260 is omitted here. Once the MSB program data loaded in cache register 410 is transferred to main register 420 through discharge circuit 460 during a data dump interval (S260), a read operation, which will be referred to hereinafter as an initial read operation, is executed during an initial read interval. During the initial read operation, a first data value that corresponds to the LSB data value that was programmed into the selected memory cell during the LSB program operation is stored in cache register 410 (S280).

During the initial read operation, latch 416 of cache register 410 is reset such that first and second latch nodes N1 and N2 are set to a logic high level and a logic low level, respectively (i.e., a second reset operation is performed). Then, a read voltage (e.g., a voltage between the threshold voltage distribution for the data value "11" and the threshold voltage distribution for the data value "10") is applied to the selected word line and the resulting voltage variation of the selected bit line is reflected on sense node S0 through signal path ③ of FIG. 8A. For example, when the threshold voltage of the selected memory cell is lower than the read voltage (i.e., when the selected memory cell has a data value of "11," which is the erased state), the voltage level of sense node S0 decreases toward a ground voltage. Thus, NMOS transistor 441 of sense circuit 440 is turned (or remains) off. That is, signal path ④ of FIG. 8A is not formed. So, although NMOS transistor 471 is turned on by the activation of control signal C4, the data value stored in cache register 410 is not changed (i.e., first and second latch nodes N1 and N2 maintain a logic high level and a logic low level, respectively). On the other hand, when the threshold voltage of the selected memory cell is greater than or equal to the read voltage (i.e., when the selected memory cell has a data value of "10"), the voltage level of sense node S0 increases to a power supply voltage, thus turning on NMOS transistor 441 of sense circuit 440. Since, during the initial read operation, NMOS transistor 471 is turned on by the activation of control signal C4 and NMOS transistor 442 is turned on by the activation of control signal C10, signal path ④ of FIG. 8A is formed when NMOS transistor 441 is turned on. Thus, first and second latch nodes N1 and N2 are set to a logic low level and a logic high level, respectively.

Once the initial read operation is completed, the selected memory cell is programmed in accordance with the MSB program data that is stored in main register 420 through a first program operation (S300). When the first program operation is performed, the voltage level of the selected bit line is determined through signal path ⑤ of FIG. 8A in accordance with the data value stored in main register 420. The first program operation is well known in the art, so description thereof is omitted herein. After the first program operation is performed, an operation is performed to determine whether or not the selected memory cell has been programmed successfully (S320). As set forth above, each program loop of the MSB program operation comprises a first program operation and "00" and "01" verify read operations. The "00" verify read operation determines whether the selected memory cell was successfully programmed from storing a data value of "10" to storing a data value of "00," and the "01" verify read operation determines whether the selected memory cell was successfully programmed from storing a data value of "11" to storing a data value of "01." The "00" and "01" verify read operations will be described in more detail below.

During the "00" verify read operation, a verify voltage Vvfy2 (see FIG. 4B) is applied to a word line and the resulting voltage variation of the selected bit line is reflected on sense node S0 through signal path ⑥ of FIG. 8B. At the same time, in accordance with the data stored in cache register 410, sense node S0 may be grounded through discharge circuit 460. That is, NMOS transistor 462 of discharge circuit 460 is turned on by the activation of control signal C12 during the "00" verify read operation, and NMOS transistor 463 of discharge circuit 460 is turned (or remains) on or off in accordance with the voltage level of first latch node N1; and thus, signal path ⑦ of FIG. 8B is selectively formed in accordance with the data stored in cache register 410.

As described above, when the selected memory cell maintains an erased state after the LSB program operation, first and second latch nodes N1 and N2 of cache register 410 are set to a logic high level and a logic low level, respectively, during the initial read operation. On the other hand, when the selected memory cell stores a data value of "10" after the LSB program operation, first and second latch nodes N1 and N2 of cache register 410 are set to a logic low level and a logic high level, respectively, during the initial read operation.

If the selected memory cell stores a data value of "11" (i.e., an erased state) after the LSB program operation, then first latch node N1 has a logic high level as a result of the initial read operation, so NMOS transistor 463 of discharge circuit 460 is turned on during the "00" verify read operation. Thus, signal path ⑦ of FIG. 8B is formed and sense node S0 is grounded as a result. Accordingly, NMOS transistor 441 of sense circuit 440 is turned off, signal path ⑧ of FIG. 8B is not formed; and thus, the data value stored in main register 420 does not change. Afterwards, in accordance with the data value stored in main register 420, the selected memory cell either continues to store the data value "11" or the selected memory cell is programmed.

On the other hand, if the selected memory cell was programmed during the LSB program operation to store a data value of "10," then first latch node N1 has a logic low level as a result of the initial read operation, so NMOS transistor 463 of discharge circuit 460 is turned (or remains) off during the "00" verify read operation. Thus, signal path ⑦ of FIG. 8B is not formed. Accordingly, the data value stored in main register 420 is selectively changed through sense circuit 440 in accordance with the voltage level of sense node S0. If the selected memory cell was programmed from storing a data value of "10" to storing a data value of "00" previously during the MSB program operation, then third and fourth latch nodes N3 and N4 of main register 420 are set to a logic high level and a logic low level, respectively; and thus, the memory cell is program-inhibited during any subsequently executed program loops. However, if the selected memory cell was not programmed from storing the data value "10" to storing the data value "00" previously during the MSB program operation, but the selected memory cell was previously programmed to store the data value "10" during the LSB program operation, then the data value stored in main register 420 does not change.

In accordance with the "00" verify read operation described above, even if the selected memory cell has been programmed to store a threshold voltage that corresponds to the data value "00," if the data stored in main register 420 indicates that the selected memory cell is to be programmed from storing a data value of "11" to storing a data value of "01," then the data stored in main register 420 is retained as program-enable data (i.e., not program-inhibit data). That is, signal path ⑦ of FIG. 8B is formed, so the data value stored in main register 420 does not change. On the other hand, if the data value stored in main register 420 indicates that the selected memory cell is to be programmed from storing a data value of "10" to storing a data value of "00," then the data stored in main register 420 is changed to program-inhibit data when the threshold voltage of the selected memory cell reaches the threshold voltage level that corresponds to the data value "00." That is, signal path ⑧ of FIG. 8B is formed, which changes the data value stored in main register 420. During the "00" verify read operation, control signals C10 and C6 are activated.

The "01" verify read operation is executed following the "00" verify read operation. During the "01" verify read operation, a verify voltage Vvfy3 (refer to FIG. 4B) is applied to the selected word line and the resulting voltage variation of the selected bit line is reflected on sense node S0 through a signal path ⑥ of FIG. 8B. For example, if the selected memory cell has a threshold voltage that is lower than verify voltage Vvfy3, then the voltage level of sense node S0 decreases toward a ground voltage. Thus, NMOS transistor 441 of sense circuit 440 is turned (or remains) off. On the other hand, if the selected memory cell has a threshold voltage that is greater than or equal to verify voltage Vvfy3, then the voltage level of the sense node S0 (in accordance with the voltage level of the selected bit line) increases toward a power supply voltage. Thus, NMOS transistor 441 of sense circuit 440 is turned on. During the "01" verify operation, control signal C12 is deactivated and control signals C6 and C10 are activated. NMOS transistors 422 and 442 are turned on by control signals C6 and C10, respectively. When the selected memory cell has a threshold voltage that is lower than verify voltage Vvfy3, then signal path ⑧ of FIG. 8B is not formed. That is, data stored in main register 420 is not changed. When the selected memory cell has a threshold voltage that is greater than or equal to verify voltage Vvfy3, then signal path ⑧ of FIG. 8B is formed; and thus, the data stored in main register 420 is changed to program-inhibit data.

After the "01" verify read operation is executed, the data stored in main register 420 is transferred to page buffer decoder circuit 600 through data output circuit 450 by enabling control signal C7. For example, when fourth latch node N4 has a logic low level, NMOS transistor 451 of data output circuit 450 is turned off. Thus, signal line DOL maintains its pre-charged state. On the other hand, when fourth latch node N4 has a logic high level, NMOS transistor 451 is turned on such that signal line DOL is grounded through signal path ⑨ of FIG. 8B. The logic state of signal line DOL is transferred to a well-known pass/fail check circuit (not shown) through page buffer decoder circuit 600. The pass/fail check circuit determines, based on the data input to the pass/fail check circuit, whether the selected memory cell has been successfully programmed. In accordance with the judgment result, another MSB program loop is executed or the MSB program operation ends.

Figure 9A:
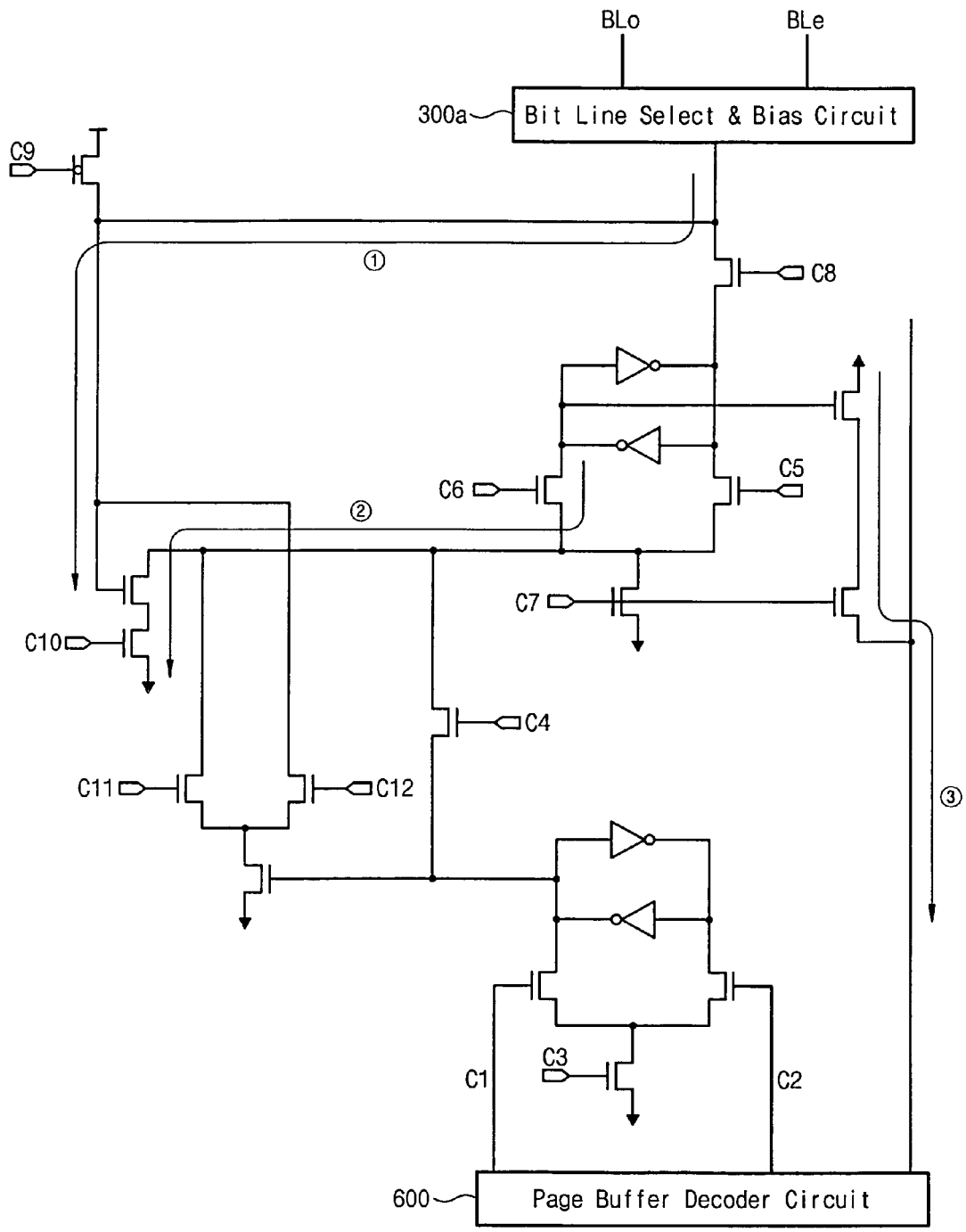
FIG. 9A is a circuit diagram illustrating the flow of data through portions of a flash memory device in accordance with the present invention during an MSB read operation.
Figure 9B:
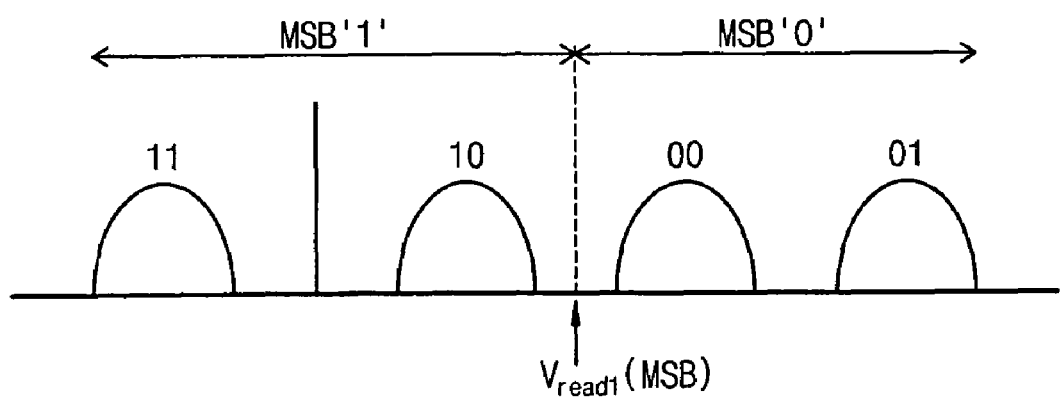
FIG. 9B shows a read voltage applied to the selected word line during an MSB read operation.

FIG. 9A is a circuit diagram illustrating the flow of data through portions of a flash memory device in accordance with the present invention during an MSB read operation, and FIG. 9B shows a read voltage applied to the selected word line during an MSB read operation. In accordance with the present invention, a memory cell may store one of four data values: "11," "10," "00," or "01." As illustrated in FIG. 9B, the four data values "11," "10," "00," and "01" are assigned, respectively, over four threshold voltage distributions that are arranged in ascending order with regard to voltage level. Accordingly, it is possible to read the MSB data stored in a selected memory cell by determining whether the data value stored in the selected memory cell is in a first or a second data value group, wherein the first data value group comprises the data values "11" and "10," and the second data value group comprises the data values "00" and "01." If the data value stored in the selected memory cell is "11" or "10" (i.e., in the first data value group), then the MSB is "1," and if the data value stored in the selected memory cell is "00" or "01" (i.e., in the second data value group), then the MSB is "0". An MSB read operation will now be described with reference to FIGS. 3, 9A, and 9B.

During the MSB read operation a read voltage Vread1 (refer to FIG. 9B) is applied to the selected word line and the resulting voltage variation of the selected bit line is reflected on sense node S0 through signal path ① of FIG. 9A. When the selected memory cell has a threshold voltage that is lower than read voltage Vread1, the voltage level of sense node S0 decreases toward a ground voltage. Thus, NMOS transistor 441 of sense circuit 440 is turned (or remains) off. On the other hand, when the selected memory cell has a threshold voltage that is greater than or equal to read voltage Vread1, the voltage level of sense node S0 increases toward a power supply voltage. Thus, NMOS transistor 441 is turned on.

During the MSB read operation, NMOS transistors 422 and 442 are turned on in accordance with the activation of control signals C6 and C10. Under the conditions set forth above, if the voltage level of sense node S0 decreases to a ground voltage, signal path ② of FIG. 9A is not formed. If the voltage level of sense node S0 increases toward a power supply voltage, signal path ② of FIG. 9A is formed. Afterwards, data stored in main register 420 is transferred to page buffer decoder circuit 600 through data output circuit 450 by enabling control signal C7 (see signal path ③ of FIG. 9A). MSB data transferred to page buffer decoder circuit 600 is transferred outside of flash memory device 1000 (of FIG. 2) through a data line bus.

Figure 10A:
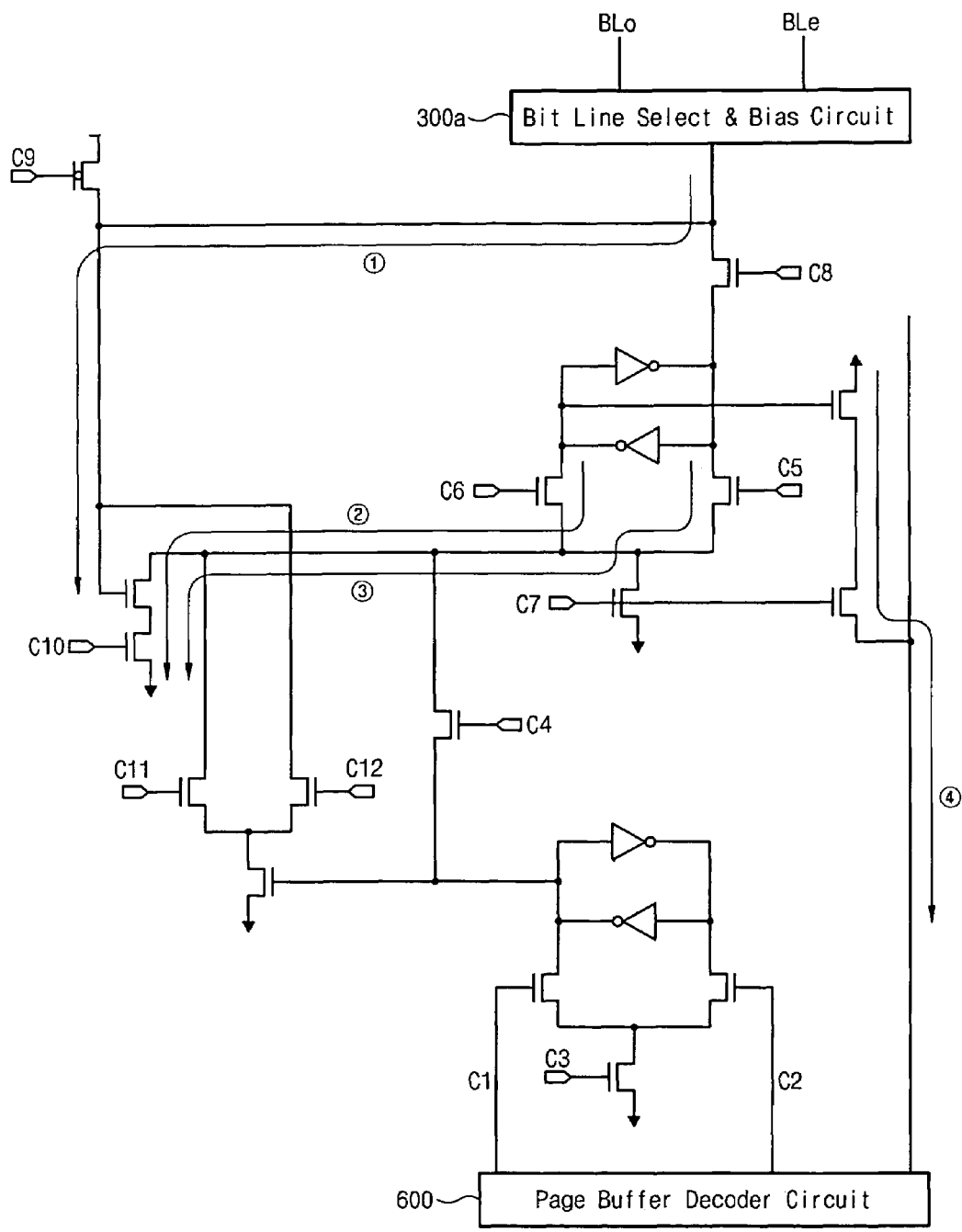
FIG. 10A is a circuit diagram illustrating the flow of data through portions of a flash memory device in accordance with the present invention during an LSB read operation.
Figure 10B:
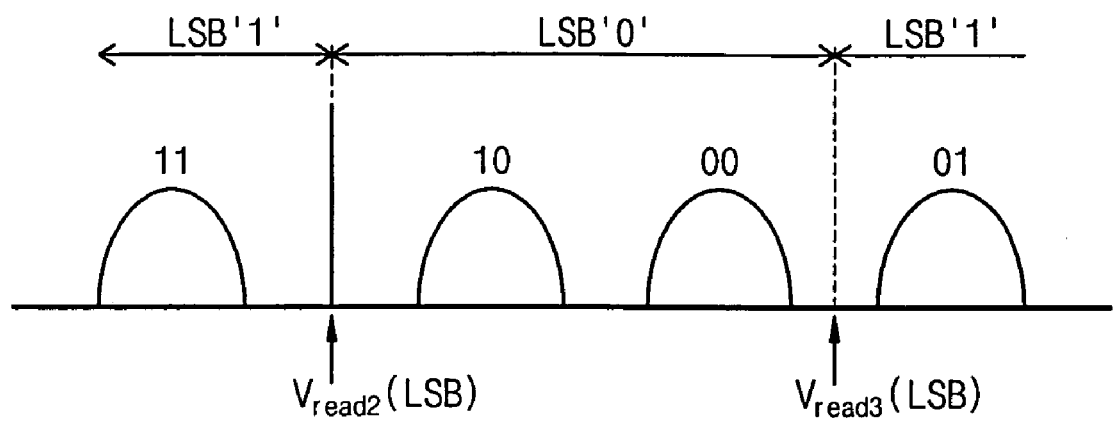
FIG. 10B shows read voltages applied to the selected word line during an LSB read operation.

FIG. 10A is a circuit diagram illustrating the flow of data through portions of a flash memory device in accordance with the present invention during an LSB read operation, and FIG. 10B shows read voltages applied to the selected word line during an LSB read operation. An LSB read operation, which comprises a first LSB sense operation and a second LSB sense operation, will now be described in detail with reference to FIGS. 3, 10A, and 10B.

During the first LSB sense operation of the LSB read operation, a read voltage Vread2 (refer to FIG. 10B) is applied to the selected word line and the resulting voltage variation of the selected bit line is reflected on sense node S0 through signal path ① of FIG. 10A. When the selected memory cell has a threshold voltage that is lower than read voltage Vread2, the voltage level of sense node S0 decreases toward a ground voltage. Thus, NMOS transistor 441 of sense circuit 440 is turned (or remains) off. On the other hand, when the selected memory cell has a threshold voltage that is greater than or equal to read voltage Vread2, the voltage level of sense node S0 increases toward a power supply voltage. Thus, NMOS transistor 441 is turned on. During the first LSB sense operation of the LSB read operation, NMOS transistors 422 and 442 are turned on in accordance with the activation of control signals C6 and C10. Under the conditions set forth above, if the voltage level of sense node S0 decreases toward a ground voltage, signal path ② of FIG. 10A is not formed. If the voltage level of sense node S0 increases toward a power supply voltage, signal path ② of FIG. 10A is formed.

During the second LSB sense operation of the LSB read operation, a read voltage Vread3 (refer to FIG. 10B) is applied to the selected word line and the resulting voltage variation of the selected bit line is reflected on sense node S0 through signal path ① of FIG. 10A. When the selected memory cell has a threshold voltage that is lower than read voltage Vread3, the voltage level of sense node S0 decreases toward a ground voltage. Thus, NMOS transistor 441 of sense circuit 440 is turned off. On the other hand, when the selected memory cell has a threshold voltage that is greater than or equal to read voltage Vread3, the voltage level of sense node S0 increases toward a power supply voltage. Thus, NMOS transistor 441 is turned on. During the second LSB sense operation of the LSB read operation, NMOS transistors 421 and 442 are turned on in accordance with the activation of control signals C5 and C10. Under the conditions set forth above, if the voltage level of sense node S0 decreases to a ground voltage, signal path ③ of FIG. 10A is not formed. If the voltage level of sense node S0 increases toward a power supply voltage, then signal path ③ of FIG. 10A is formed.

Afterwards, LSB data stored in main register 420 is transferred to page buffer decoder circuit 600 through data output circuit 450 by enabling control signal C7 (see signal path ④ of FIG. 10A). LSB data transferred to page buffer decoder circuit 600 is transferred outside of flash memory device 1000 through a data line bus.

A page buffer circuit of a flash memory device in accordance with the present invention performs program and read functions for multi-bit data, and also performs cache program and page copy-back functions for single-bit data. The cache program and page copy-back operations will be now described.

In the cache program operation, during the execution of the first program operation described above, data to be programmed during the next first program operation is loaded into cache register 410.

Figure 11:
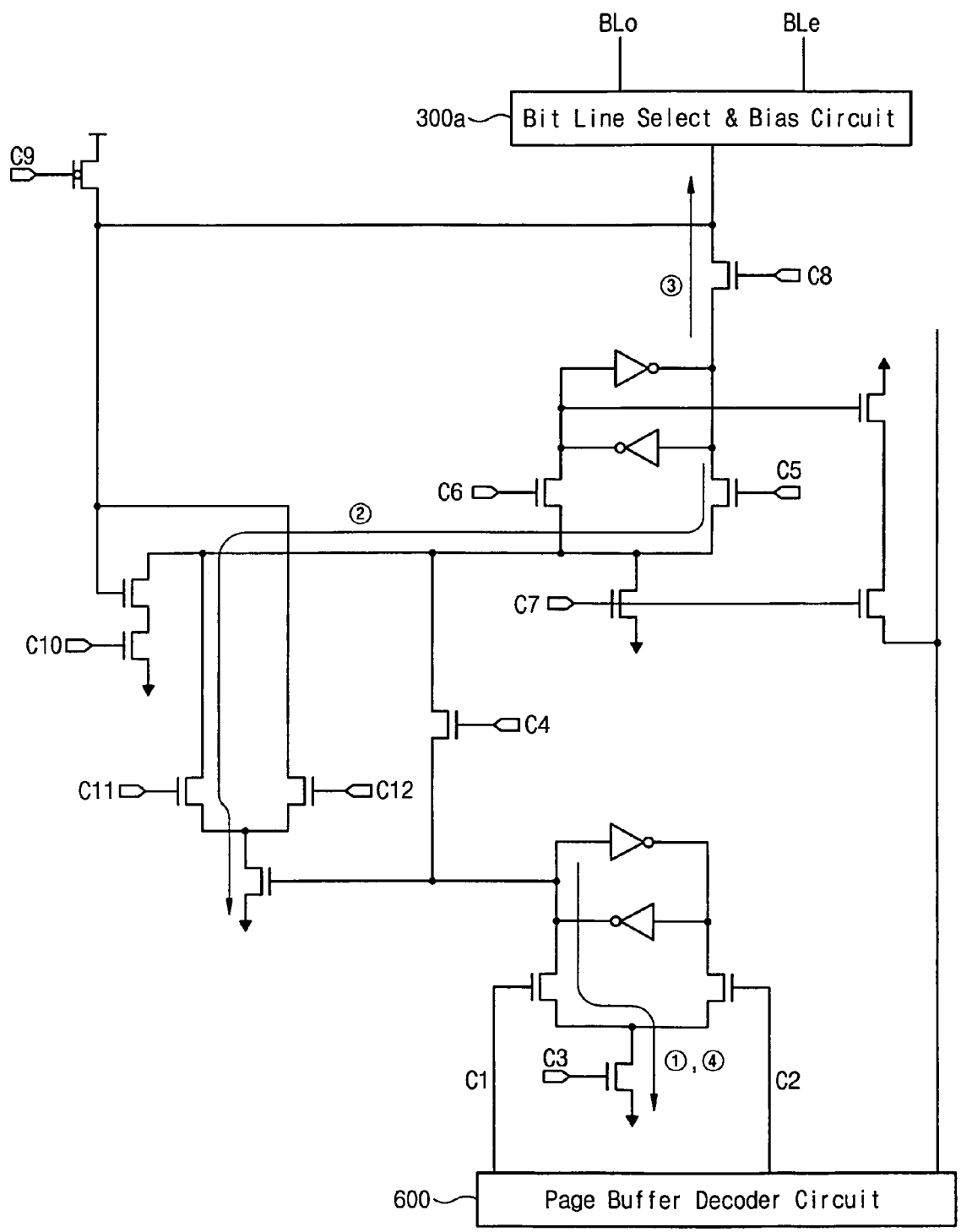
FIG. 11 is a circuit diagram illustrating the flow of data through portions of a flash memory device in accordance with the present invention during a cache program operation.

The cache program operation will now be described in more detail with reference to FIGS. 3 and 11. Program data is first loaded into cache register 410 through signal path ① of FIG. 11, and the data in cache register 410 is then transferred into main register 420 through signal path ② FIG. 11. Once program data is transferred to main register 420, the voltage level of the selected bit line is determined in accordance with the data stored in main register 420 through signal path ③ of FIG. 11. The operational steps illustrated by signal paths ①, ②, and ③ of FIG. 11 are the same as those described above with reference to signal paths ①, ②, and ③ FIG. 6, so description thereof is omitted here. Then, a first program operation is performed, wherein the first program operation is the same as the first program operation mentioned previously. Also, as mentioned previously, the first program operation is well known in the art, so a description thereof is omitted here. While the data in main register 420 is programmed, program data corresponding to the data value that will be programmed next is loaded into cache register 410 through signal path ④ of FIG. 11. The preceding operational steps are repeated in the manner described above with reference to FIG. 11 until the desired amount of data has been programmed.

Figure 12A:
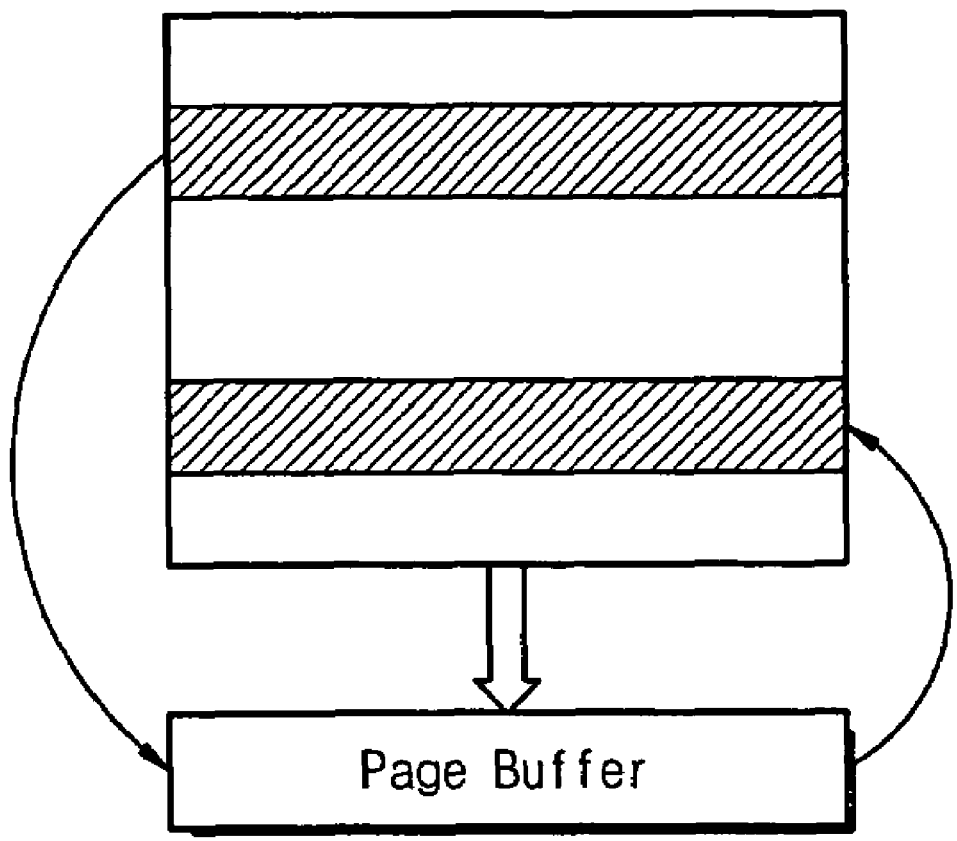
FIG. 12A is a diagram illustrating a page copy-back operation of a flash memory device in accordance with the present invention.
Figure 12B:
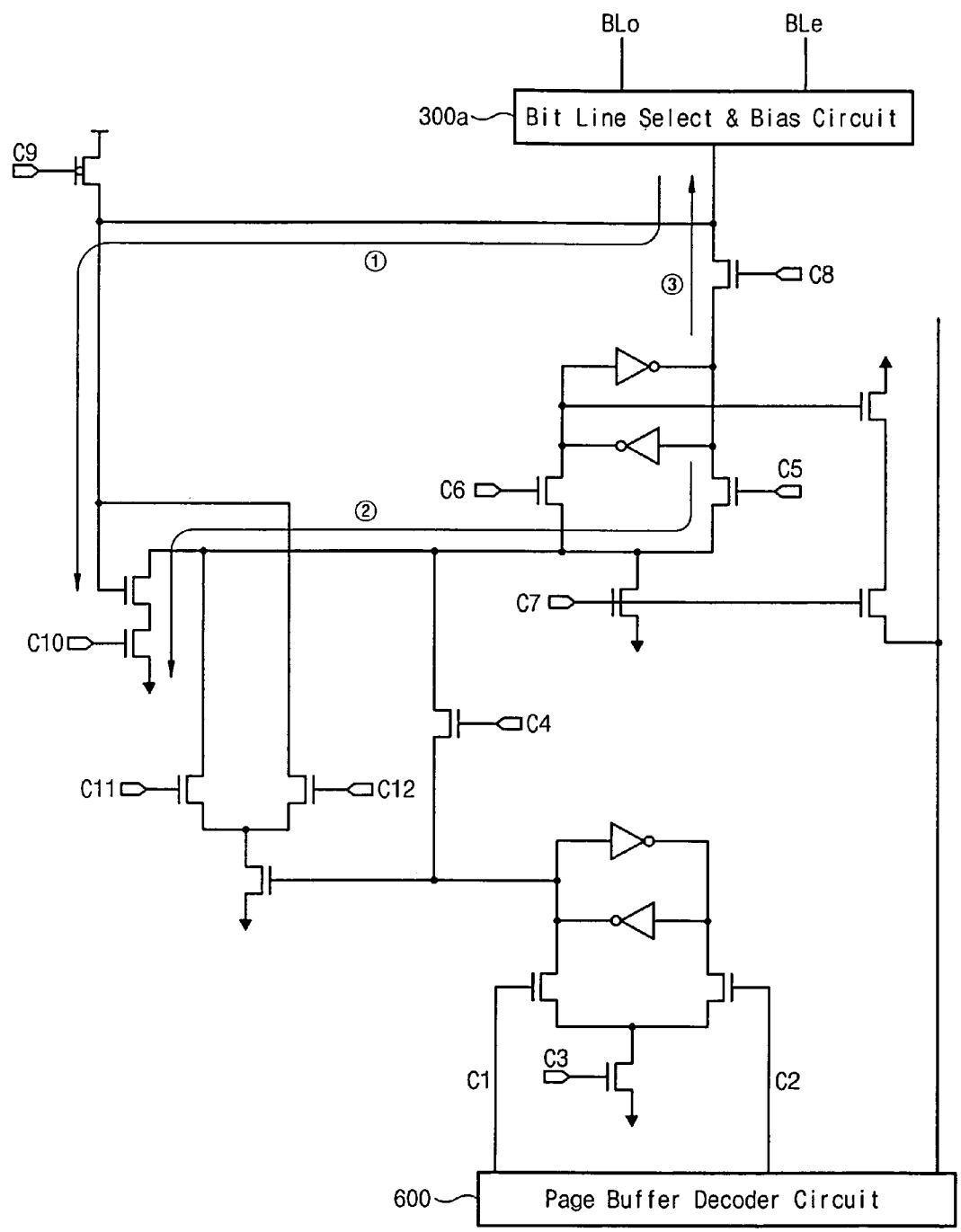
FIG. 12B is a circuit diagram illustrating the flow of data through portions of a flash memory device in accordance with the present invention during the page copy-back operation of FIG. 12A.

In a page copy-back operation, as illustrated in FIG. 12A, a page buffer circuit reads data stored in one page, and then programs that data into another page. Referring to FIG. 12B, which illustrates the flow of data through portions of a flash memory device in accordance with the present invention during a page copy-back operation, and FIG. 3, data read through signal paths ① and ② of FIG. 12B is stored in main register 420. The data stored in main register 420 is then programmed into another page through signal path ③ of FIG. 12B. The operational steps illustrated by signal paths ① and ② of FIG. 12B are the same as those described above with reference to signal paths ① and ③ of FIG. 10A, respectively, so description thereof is omitted here. Also, the operational step illustrated by signal path ③ of FIG. 12B is the same as the operational step described above with reference to signal path ③ of FIG. 6, so a description thereof is omitted here.

Figure 13A:
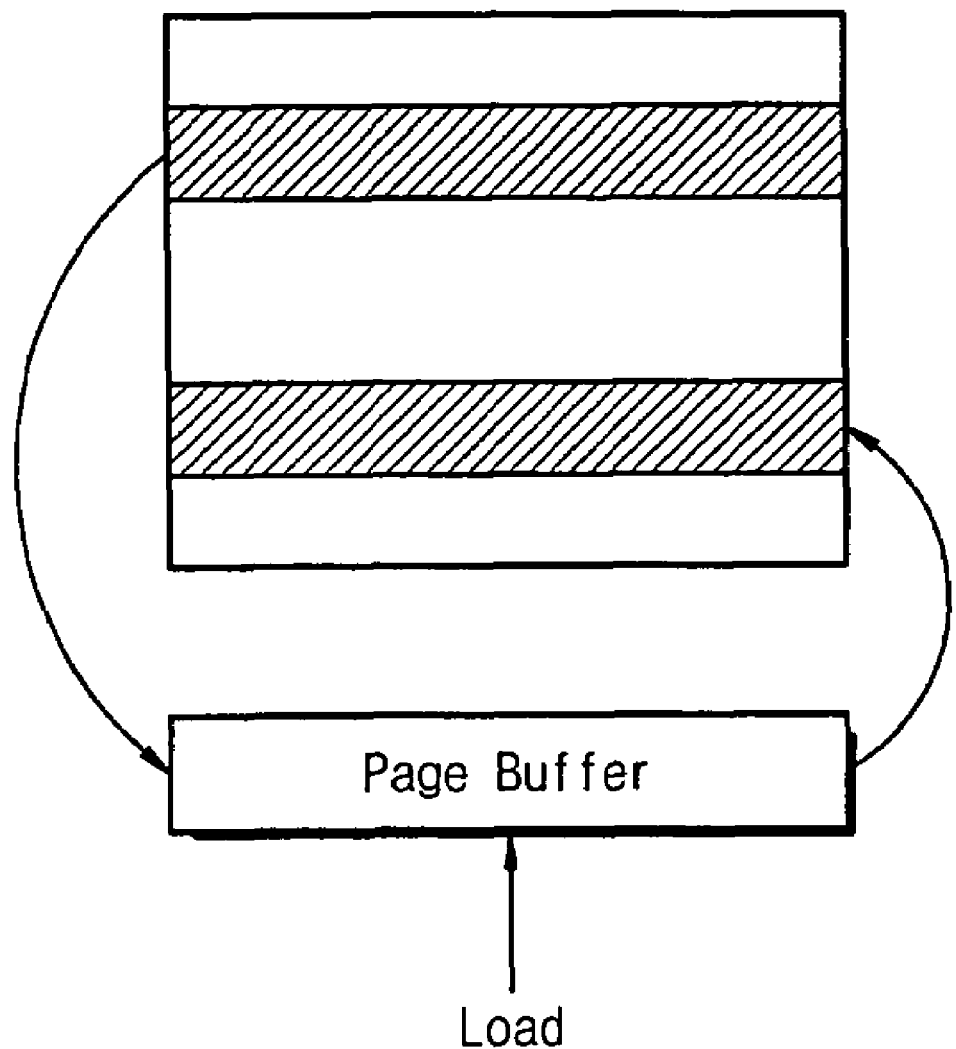
FIG. 13A is a diagram illustrating another page copy-back operation in accordance with the present invention; and, FIG. 13B illustrates the flow of data through portions of a flash memory device in accordance with the present invention during the page copy-back operation of FIG. 13A.
Figure 13B:
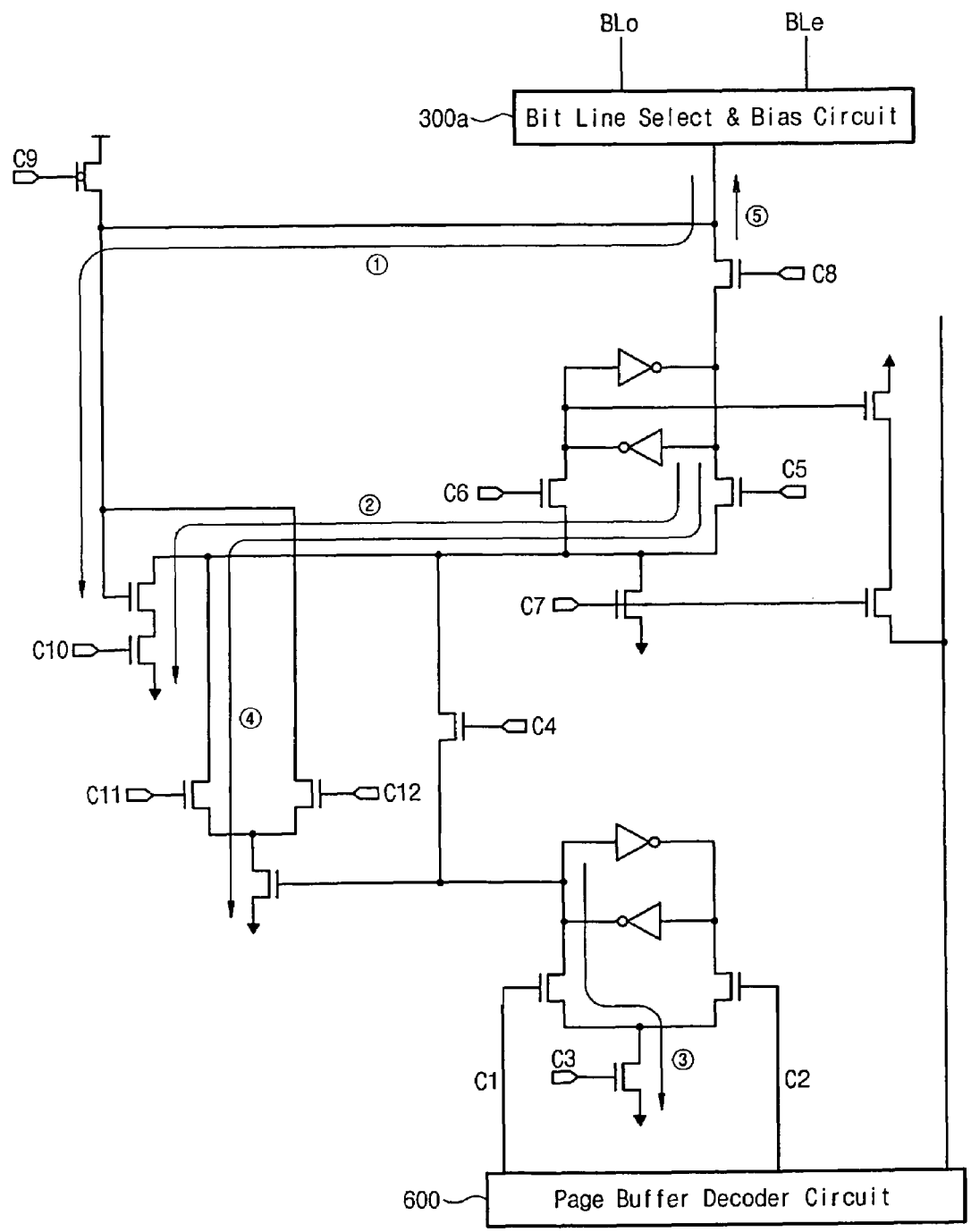

It is possible to update a portion of the data read from one page during a page copy-back operation. That is, as illustrated in FIG. 13A, a page buffer circuit reads data stored in one page, and data to be updated is loaded into the page buffer circuit. Then, data stored in the page buffer circuit is programmed into another page. FIG. 13B illustrates the flow of data through portions of a flash memory device in accordance with the present invention during a page copy-back operation. Referring to FIGS. 3 and 13B, data is first read through signal path ① of FIG. 13B, and then is stored in main register 420 through signal path ② of FIG. 13B. Data to be updated is then loaded into cache register 410 through signal path ③ of FIG. 13B in the same manner as described above with reference to signal path ① of FIG. 6. Then, data in cache register 410 is transferred to main register 420 through signal path ④ of FIG. 13B, and the data stored in main register 420 is then programmed into another page through signal path ⑤ of FIG. 13B. The operational steps that correspond to signal paths ① and ② of FIG. 13B are the same as those described above with reference to signal paths ①, and ③ of FIG. 10A, respectively, so description thereof is omitted here. In addition, the operational steps that correspond to signal paths ③, ④, and ⑤ of FIG. 13B are the same as the operational steps described above with reference to signal paths ①, ②, and ③ of FIG. 6, so description thereof is omitted here.

The activations of the various control signals within a page buffer are not limited to the exemplary activations described above. For example, it will be clear to one skilled in the art that the activation of various control signals within a page buffer can be changed in accordance with reset states of the latches in registers 410 and 420. Also, it will be clear to one of ordinary skill in the art that single-bit program and read operations may also be performed in a flash memory device comprising a page buffer in accordance with an embodiment of the invention.

As described above, it is possible to perform various operations in a flash memory device comprising a single page buffer structure.

The operations described above are each performed in relation to a single memory cell; however, it will be clear to one of ordinary skill in the art that the operations could be applied to multiple memory cells in various ways.

The invention has been described with reference to exemplary embodiments. However, it will be understood that the scope of the invention is not limited to the disclosed embodiments, but rather is intended to cover various modifications, adaptations, and alternate arrangements. The scope of the claims, therefore, should be accorded the broadest interpretation so as to encompass all such modifications, adaptations, and alternative arrangements.

What is claimed is:

1. A flash memory device comprising:
    a plurality of memory cells arranged along a plurality of bit lines and a plurality of word lines;
    a sense node connected to a selected bit line;
    a sense circuit configured to selectively provide a first voltage to a common node in accordance with a voltage level of the sense node;
    a first register connected to the sense node and the common node and configured to store data in accordance with a voltage level of the common node;
    a second register configured to store data in accordance with the voltage level of the sense node;
    a switch configured to provide a second voltage to the second register; and,
    a discharge circuit configured to selectively discharge the sense node in accordance with the data stored in the second register.

2. The flash memory device of claim 1, wherein the sense circuit is configured to selectively provide a third voltage to the common node in accordance with the voltage level of the sense node regardless of the data stored in the second register.

3. The flash memory device of claim 1, wherein the second register is configured to store program data provided through a page buffer decoder circuit.

4. The flash memory device of claim 3, wherein the discharge circuit is configured to discharge the common node in accordance with the program data stored in the second register.

5. The flash memory device of claim 1, wherein the discharge circuit comprises:
    a first transistor having a source, a drain connected to the sense node, and a gate connected to a first discharge control signal; and,
    a second transistor having a source connected to a ground voltage, a drain connected to the source of the first transistor, and a gate connected to a first latch node of the second register.

6. The flash memory device of claim 5, wherein the discharge circuit further comprises:

a third transistor having a source connected to the drain of the second transistor, a drain connected to the common node, and a gate connected to a second discharge control signal.

7. The flash memory device of claim 1, wherein the switch comprises a transistor having a source connected to the common node, a drain connected to the second register, and a gate connected to a switch control signal.

8. The flash memory device of claim 1, further comprising:
a data output circuit configured to output data stored in the first register to a data line bus via a page buffer decoder circuit.

9. The flash memory device of claim 1, wherein the first register is configured to drive the selected bit line with a bit line bias voltage in accordance with the data value stored in the first register.

10. A flash memory device comprising:
an array of memory cells arranged along a plurality of word lines and a plurality of bit lines;
a bit line select and bias block configured to select a group of bit lines comprising at least one of the plurality of bit lines; and,
a page buffer block comprising a plurality of page buffers, each page buffer corresponding to at least one of the plurality of bit lines,
wherein each of the page buffers comprises:
a sense node connected to a corresponding bit line through the bit line select and bias block;
a sense circuit configured to selectively provide a first voltage to a common node in accordance with a voltage level of the sense node;
a first register connected to the sense node and the common node and configured to store data in accordance with a voltage level of the common node;
a second register configured to store data in accordance with the voltage level of the sense node;
a switch configured to provide a second voltage to the second register; and,
a discharge circuit configured to selectively discharge the sense node in accordance with the data stored in the second register.

11. The flash memory device of claim 10, wherein the sense circuit is configured to selectively provide a voltage to the common node in accordance with the voltage level of the sense node regardless of the data stored in the second register.

12. The flash memory device of claim 11, wherein the second register is configured to store program data provided through a page buffer decoder circuit.

13. The flash memory device of claim 12, wherein the discharge circuit is configured to discharge the common node in accordance with the program data stored in the second register.

14. The flash memory device of claim 10, wherein the discharge circuit comprises:
a first transistor having a source, a drain connected to the sense node, and a gate connected to a first discharge control signal;
a second transistor having a source connected to a ground voltage, a drain connected to the source of the first transistor, and a gate connected to a first latch node of the second register; and,
a third transistor having a source connected to the drain of the second transistor, a drain connected to the common node, and a gate connected to a second discharge control signal.

15. The flash memory device of claim 10, wherein the switch comprises a transistor having a source connected to the common node, a drain connected to the second register, and a gate connected to a switch control signal.

16. The flash memory device of claim 10, wherein each of the page buffer circuits further comprises a data output circuit configured to output data stored in the first register to a data line bus via a page buffer decoder circuit.

* * * * *